(12) United States Patent
Kumagai et al.

(10) Patent No.: US 11,545,355 B2
(45) Date of Patent: Jan. 3, 2023

(54) SUBSTRATE PROCESSING METHOD AND SUBSTRATE PROCESSING APPARATUS

(71) Applicant: TOKYO ELECTRON LIMITED, Tokyo (JP)

(72) Inventors: Kae Kumagai, Miyagi (JP); Toru Hisamatsu, Hillsboro, OR (US); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 136 days.

(21) Appl. No.: 17/097,141

(22) Filed: Nov. 13, 2020

(65) Prior Publication Data

US 2021/0143004 A1 May 13, 2021

(30) Foreign Application Priority Data

Nov. 13, 2019 (JP) .............................. JP2019-205415
Sep. 11, 2020 (JP) .............................. JP2020-152825

(51) Int. Cl.

| | |
|---|---|
| H01L 21/02 | (2006.01) |
| C23C 16/455 | (2006.01) |
| C23C 16/52 | (2006.01) |
| H01L 21/3065 | (2006.01) |
| H01L 21/308 | (2006.01) |
| H01L 21/66 | (2006.01) |
| H01J 37/32 | (2006.01) |

(52) U.S. Cl.
CPC .... *H01L 21/0228* (2013.01); *C23C 16/45527* (2013.01); *C23C 16/45544* (2013.01); *C23C 16/52* (2013.01); *H01J 37/32449* (2013.01); *H01L 21/02274* (2013.01); *H01L 21/308* (2013.01); *H01L 21/3065* (2013.01); *H01L 22/26* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 9,837,270 | B1* | 12/2017 | Varadarajan | ...... H01L 21/02529 |
| 2005/0070041 | A1 | 3/2005 | Wu et al. | |
| 2015/0279681 | A1* | 10/2015 | Knoops | ............... H01L 21/0228 427/8 |
| 2019/0211450 | A1* | 7/2019 | Adachi | ............ H01L 21/02274 |
| 2019/0368038 | A1* | 12/2019 | Winkler | .................. C23C 16/52 |
| 2020/0032389 | A1* | 1/2020 | Lei | ...................... C23C 16/4404 |

\* cited by examiner

*Primary Examiner* — Asok K Sarkar
(74) *Attorney, Agent, or Firm* — Weihrouch IP

(57) ABSTRACT

A method for processing a substrate includes: (a) exposing a substrate with a pattern formed on a surface thereof to a first reactive species in a chamber, thereby adsorbing the first reactive species onto the surface of the substrate; (b) exposing the substrate to plasma formed by a second reactive species in the chamber, thereby forming a film on the surface of the substrate; and (c) repeating a processing including (a) and (b) two or more times while changing a residence amount of the first reactive species at a time of starting (b).

18 Claims, 20 Drawing Sheets

FIG. 8

| CONDI-TION ID | STEP NO. | PRE-SSURE | RADIO FREQUENCY(HP) | GAS | FLOW RATE | PROCESS-ING TIME | TEMPER-ATURE |
|---|---|---|---|---|---|---|---|
| P100 | 1 | XXmT |  | X/Y | R1/R2 | 2 sec | T1/T2/T3 |
|  | 2 | XXmT |  | Y | R2 | 10 sec | T1/T2/T3 |
|  | 3 | XXmT | Z1MHz/Z2W | Y | R2 | 2 sec | T1/T2/T3 |
|  | 4 | XXmT |  | Y | R2 | 1 sec | T1/T2/T3 |
| P200 | 1 | XXmT | Z1MHz/Z2W | X/Y | R1/R2 | 10 sec | T1/T2/T3 |
| P301 | 1 | XXmT |  | X/Y | R1/R2 | 2 sec | T1/T2/T3 |
|  | 2 | XXmT |  | Y | R2 | 0.5 sec | T1/T2/T3 |
|  | 3 | XXmT | Z1MHz/Z2W | Y | R2 | 2 sec | T1/T2/T3 |
|  | 4 | XXmT |  | Y | R2 | 1 sec | T1/T2/T3 |
| P302 | 1 | XXmT |  | X/Y | R1/R2 | 2 sec | T1/T2/T3 |
|  | 2 | XXmT |  | Y | R2 | 0.7 sec | T1/T2/T3 |
|  | 3 | XXmT | Z1MHz/Z2W | Y | R2 | 2 sec | T1/T2/T3 |
|  | 4 | XXmT |  | Y | R2 | 1 sec | T1/T2/T3 |
| P302 | 1 | XXmT |  | X/Y | R1/R2 | 2 sec | T1/T2/T3 |
|  | 2 | XXmT |  | Y | R2 | 1 sec | T1/T2/T3 |
|  | 3 | XXmT | Z1MHz/Z2W | Y | R2 | 2 sec | T1/T2/T3 |
|  | 4 | XXmT |  | Y | R2 | 1 sec | T1/T2/T3 |
| ... | ... | ... | ... | ... | ... | ... | ... |
| P500 | ... | ... | ... | ... | ... | ... | ... |
| ... | ... | ... | ... | ... | ... | ... | ... |

FIG. 9

| PROCESSING ID | NUMBER OF CYCLES | CONDITION ID/ PROCEDURE |
|---|---|---|
| S001 | 1 | P200 |
| S002 | 40 | P301 |
| S003 | 70 | P302 |
| S004 | 105 | P303 |
| S005 | 200 | P100 |
| ... | | |
| S100 | 10 | P500 |
| ... | | |
| S500 | 5 | S001→S003→S100 |

FIG. 13

| DEVICE ID | MEASURED VALUE | | PROCESSING ID |
|---|---|---|---|
| | ASPECT RATIO | PSD | |
| D100 | 10 | pattern 5 | P200 |
| D105 | 36 | pattern 32 | P360 |
| ... | ... | ... | ... |
| ... | | | |
| | | | |
| | | | |
| | | | |

(1)  (2)

SUBSTRATE PROCESSING METHOD AND SUBSTRATE PROCESSING APPARATUS

CROSS-REFERENCE TO RELATED APPLICATIONS

This application is based on and claims priority from Japanese Patent Application Nos. 2019-205415 and 2020-152825, filed on Nov. 13, 2019 and Sep. 11, 2020, respectively, with the Japan Patent Office, the disclosures of which are incorporated herein in their entireties by reference.

TECHNICAL FIELD

The present disclosure relates to a substrate processing method and a substrate processing apparatus.

BACKGROUND

The atomic layer deposition (ALD) is known as a technique used for manufacturing a semiconductor device. The ALD is classified into a kind of a chemical vapor deposition (CVD). The CVD is a method of forming a film on a substrate by placing the substrate in a chamber, introducing gases containing components of a film desired to be formed into the chamber, and causing a chemical reaction on the surface of the substrate or in a gas phase state. Unlike the CVD, the ALD does not introduce the multiple reaction gases into the chamber at once. First, the ALD introduces a first reaction gas (precursor) into the chamber to adsorb the first reaction gas onto the substrate, and discharges the first reaction gas that has not been adsorbed from the chamber. Subsequently, the ALD introduces a second reaction gas into the chamber to cause a reaction between the second reaction gas and the components of the first reaction gas adsorbed onto the substrate, thereby forming a film. Since the ALD controls the film thickness to an atomic layer level using the self-controllability, the ALD is used for precisely forming a film. See, e.g., US Patent Application Publication No. 2005/0070041.

SUMMARY

According to an aspect of the present disclosure, a method for processing a substrate includes: (a) exposing a substrate with a pattern formed on a surface thereof to a first reactive species in a chamber, thereby adsorbing the first reactive species onto the surface of the substrate; (b) exposing the substrate to plasma formed by a second reactive species in the chamber, thereby forming a film on the surface of the substrate; and (c) repeating a processing including (a) and (b) two or more times while changing a residence amount of the first reactive species at a time of starting (b).

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8 is a view illustrating an example of processing conditions stored in the substrate processing apparatus according to the first embodiment.

FIG. 9 is a view illustrating an example of processings stored in the substrate processing apparatus according to the first embodiment.

FIG. 13 is a view illustrating an example of a configuration of information stored in an association storage unit.

DETAILED DESCRIPTION

Figure 1:
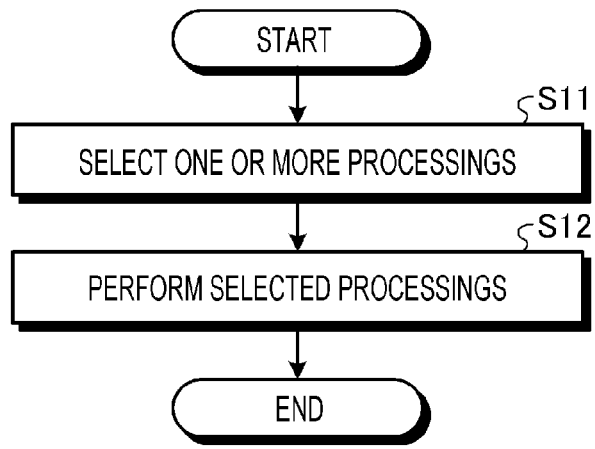
FIG. 1 is a flowchart illustrating an example of the flow of a substrate processing method according to a first embodiment.

In the following detailed description, reference is made to the accompanying drawing, which form a part hereof The illustrative embodiments described in the detailed description, drawing, and claims are not meant to be limiting. Other embodiments may be utilized, and other changes may be made without departing from the spirit or scope of the subject matter presented here.

Hereinafter, embodiments of the present disclosure will be described in detail based on the accompanying drawings. The embodiments are not limited. The embodiments may be appropriately combined with each other within a scope that does not cause any inconsistency in process contents. In the respective drawings, similar or corresponding components will be denoted by the same reference numerals.

In the descriptions herein below, the term "above" indicates the direction toward the ceiling of a processing apparatus, that is, the direction of the front surface of a substrate placed in the processing apparatus. The "below" indicates the direction toward the bottom of the processing apparatus, that is, the direction of the back surface of the substrate placed in the processing apparatus. The terms "upper" and "lower" may be used to indicate a portion of a pattern formed on the substrate. An "upper" side indicates the front surface of the substrate, that is, the side of the substrate to be subjected to a processing such as, for example, film formation or etching. A "lower" side indicates the back surface of the substrate, that is, the side of the substrate which is not subjected to a processing such as, for example, film formation or etching. The thickness direction of the substrate may be referred to as a vertical direction, and the direction parallel to the surface of the substrate may be referred to as a horizontal direction.

In the descriptions herein below, a "reactive species" includes a gas containing a reactive species.

First Embodiment

FIG. 1 is a flowchart illustrating an example of the flow of a substrate processing method according to a first embodiment. The substrate processing method according to the first embodiment is executed by a substrate processing apparatus that controls a processing apparatus (e.g., a chamber) where a processing such as, for example, etching, film formation or cleaning is performed.

First, the substrate processing apparatus selects one or more processings to be continuously performed on a substrate (e.g., a semiconductor substrate formed of silicon) (step S11). Subsequently, the substrate processing apparatus causes the processing apparatus to perform the selected processings (step S12). When the performance of the processings is completed, the processings end.

Here, the "processing" includes one or more processings performed on the substrate. The one or more processings are, for example, a film formation, an etching, a cleaning, and a temperature controlling. Further, the "processing" includes information about an order of performing the one or more processings.

FIGS. 2A to 2D are flowcharts illustrating the flows of Processing Examples 1 to 4 performed by the substrate processing method according to the first embodiment.

Figure 2A:
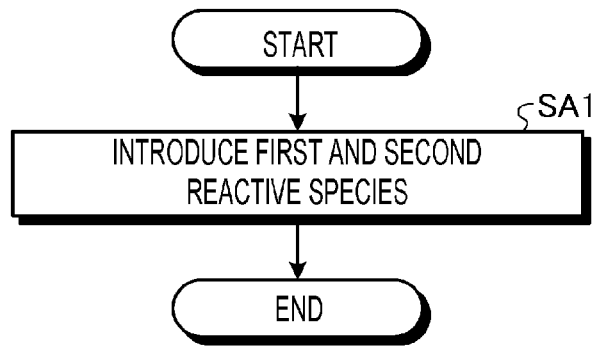
FIG. 2A is a flowchart illustrating the flow of Processing Example 1 performed by the substrate processing method according to the first embodiment.

Processing Example 1 illustrated in FIG. 2A is a film formation processing by the CVD. First, the substrate processing apparatus causes a reaction between a first reactive species and a second reactive species in a chamber, to form a film on the surface of the substrate (step SA1). Then, the substrate processing apparatus ends the processing.

Figure 2B:
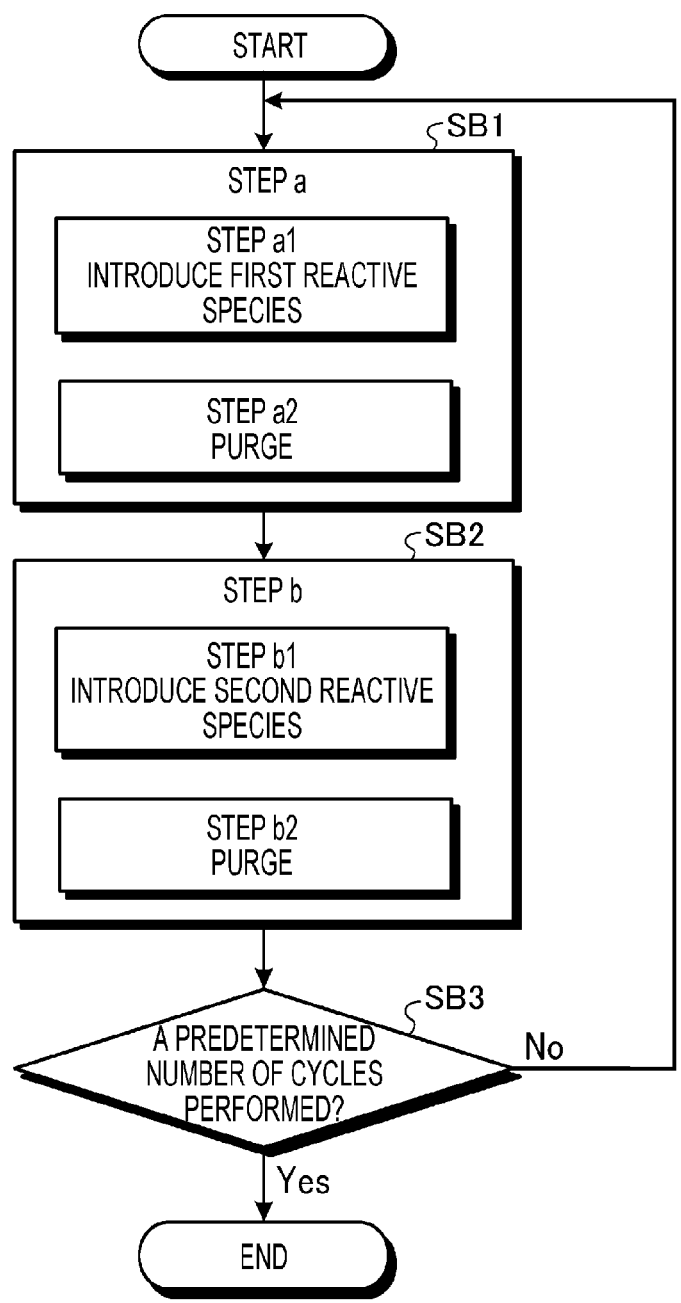
FIG. 2B is a flowchart illustrating the flow of Processing Example 2 performed by the substrate processing method according to the first embodiment.

Processing Example 2 illustrated in FIG. 2B is a film formation processing by the ALD (including a "mix mode" to be described later). The processing of Processing Example 2 includes steps "a" and "b." In step "a," the substrate processing apparatus exposes the substrate with a pattern formed on the surface thereof to the first reactive species in the chamber, so as to adsorb the first reactive species onto the surface of the substrate (step SB1). Subsequently, in step "b," the substrate processing apparatus exposes the substrate to plasma formed from the second reactive species in the chamber, so as to form a film on the surface of the substrate (step SB2). The substrate processing apparatus determines whether a predetermined number of cycles have been performed (step SB3). When it is determined that the predetermined number of cycles have not been performed (steps SB3, No), the substrate processing apparatus returns to step SB1, and repeats the processing. Meanwhile, when it is determined that the predetermined number of cycles have been performed (step SB3, Yes), the substrate processing apparatus ends the processing.

As illustrated in FIG. 2B, step "a" may include step a1 of adsorbing the first reactive species onto the substrate and step a2 of purging at least a portion of the first reactive species from the chamber. Similarly, step "b" may include step b1 of introducing the second reactive species into the chamber to form plasma and form a film, and step b2 of purging at least a portion of the second reactive species from the chamber.

Figure 2C:
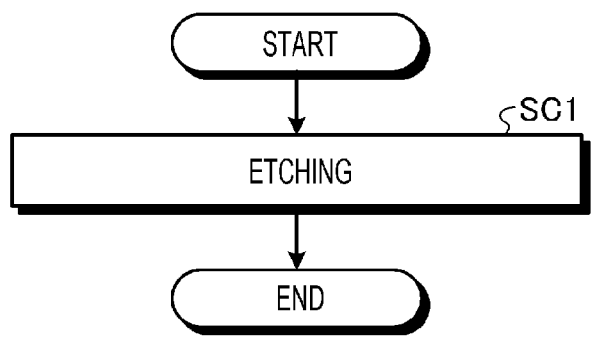
FIG. 2C is a flowchart illustrating the flow of Processing Example 3 performed by the substrate processing method according to the first embodiment.

Processing Example 3 illustrated in FIG. 2C is an etching. First, the substrate processing apparatus performs an etching (step SC1). Then, the substrate processing apparatus ends the processing.

Figure 2D:
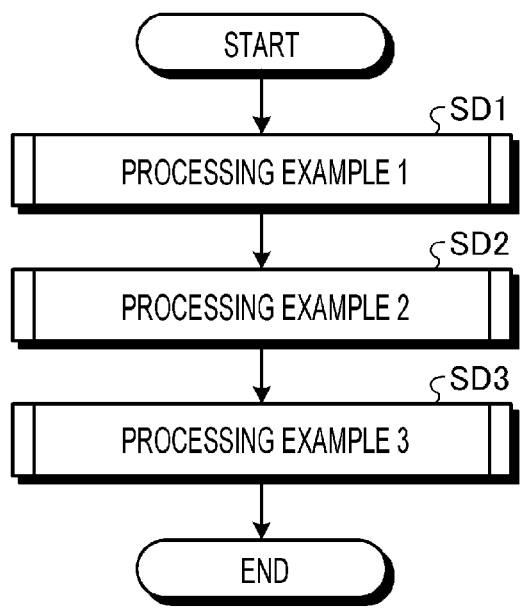
FIG. 2D is a flowchart illustrating the flow of Processing Example 4 performed by the substrate processing method according to the first embodiment.

Processing Example 4 illustrated in FIG. 2D is a processing in which a film formation and an etching are combined with each other under different conditions. Processing Example 4 is a processing of performing Processing Examples 1, 2, and 3 in an order. The substrate processing apparatus first performs Processing Example 1 (step SD1). Subsequently, the substrate processing apparatus performs Processing Example 2 (step SD2). Subsequently, the substrate processing apparatus performs Processing Example 3 (step SD3). Then, the substrate processing apparatus ends the processing.

Further, the "processing" includes information about a processing condition of each processing. The information about a processing condition includes, for example, a pressure in the chamber, a frequency and a power of a radio frequency applied for generating plasma, a type and a flow rate of a gas, a processing time, and a temperature of each unit of the chamber. Further, the "processing" includes information about the number of times of performing each processing and the number of times of repeating a plurality of processings in a predetermined order. For example, when a plurality of cycles is performed in Processing Example 2 illustrated in FIGS. 2A to 2D, different processing conditions may be set for the cycles. The "processing" performed by the substrate processing method according to the first embodiment includes one or more processings that implement a film formation with different coverages, for example, on a pattern having a height difference on the substrate.

Here, the "coverage" refers to a ratio of a film formed on the upper portion of the pattern having the height difference on the substrate to a film formed on the lower portion of the pattern. The coverage refers to, for example, a ratio of the film thickness of a film formed on the upper portion of the inner periphery of a hole formed in the substrate to the film thickness of a film formed on the lower portion of the inner periphery of the hole. Further, for example, the coverage refers to a ratio of the film thickness of a film formed on the surface of the substrate to the film thickness of a film formed on the bottom surface of a hole formed in the substrate. For example, in the film formation processing using the CVD, a film is mainly formed on the upper portion of the pattern.

Meanwhile, in the film formation processing using the ALD, a film is constantly formed on the surface of the substrate, regardless of the height difference of the pattern. In this way, the coverage changes according to the film forming method.

Figure 3A:
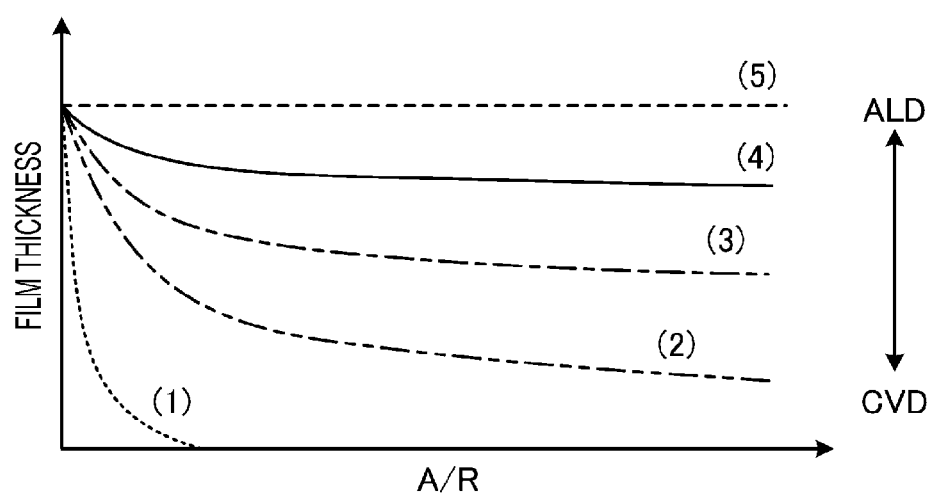
FIG. 3A is a view illustrating a relationship between a film forming method and a coverage.

FIG. 3A is a view illustrating a relationship between the film forming method and the coverage. In the graph of FIG. 3A, the horizontal axis represents a vertical position in a pattern formed on the substrate, for example, a hole (referred to as an aspect ratio herein). The vertical axis represents the film thickness of a film formed on the pattern. For example, the graph (1) represents a state where the film thickness of a film formed on a position with a relatively low aspect ratio, that is, the upper portion of the pattern is relatively large, and no film is formed on a position with a relatively high aspect ratio, that is, the lower portion of the pattern. The graphs (2) to (4) represent a state where the film thickness of a formed film gradually decreases from the upper portion toward the lower portion of the pattern. The graph (5) represents a state where the film thickness of a formed film is substantially uniform over the upper portion to the lower portion of the pattern.

Figure 3B:
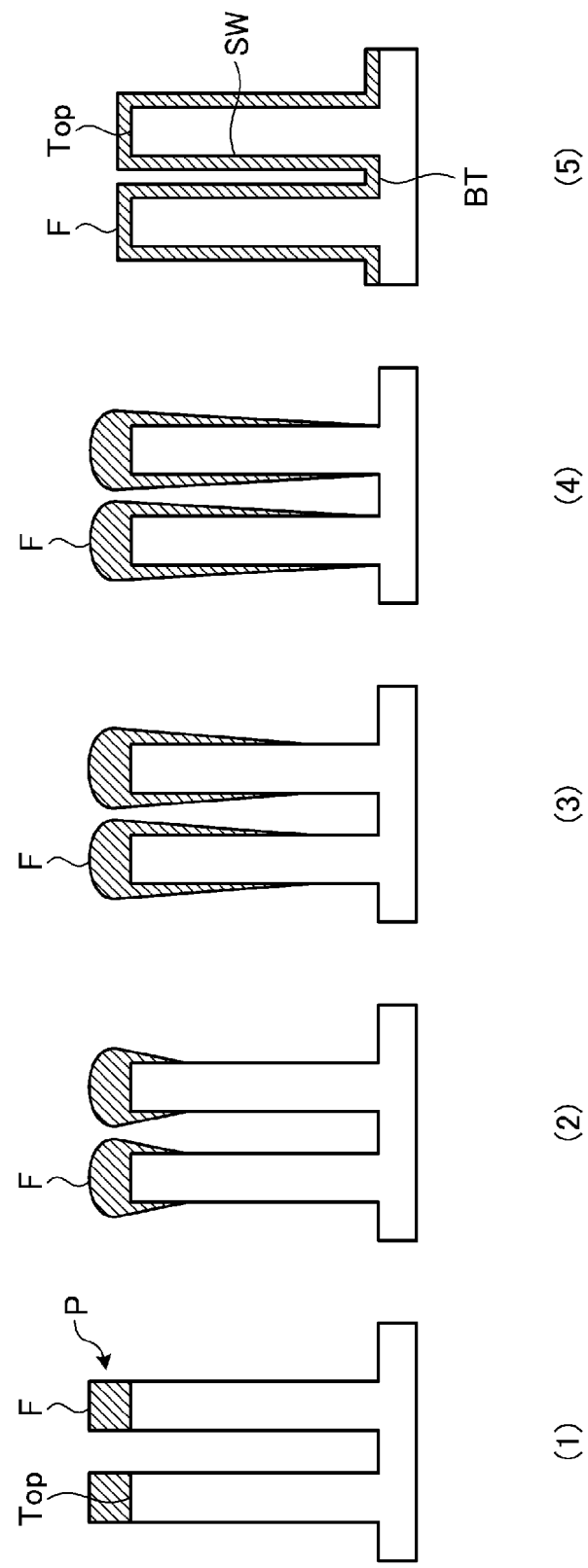
FIG. 3B is a schematic vertical cross-sectional view of each of patterns that correspond to (1) to (5) of FIG. 3A.

FIG. 3B is a schematic vertical cross-sectional view of each of the patterns that correspond to (1) to (5) of FIG. 3A. In FIG. 3B, the pattern (1) represents a state where a film F is formed only on the top Top of a pattern P. In FIG. 3B, the patterns (2) to (4) represent a state where the film formation amount gradually changes over the top Top, the upper portion of the side wall SW, and the lower portion of the side wall SW of the pattern P. In FIG. 3B, the pattern (5) represents a state where the film F is formed with the substantially uniform thickness over the top Top, the upper portion of the side wall SW, the lower portion of the side wall SW, and the bottom BT of the pattern P. In FIG. 3B, the patterns (1) to (5) substantially correspond to the graphs (1) to (5) of FIG. 3A, respectively.

Next, each of the methods for implementing the coverages of (1) to (5) of FIGS. 3A and 3B will be described.

Figure 4:
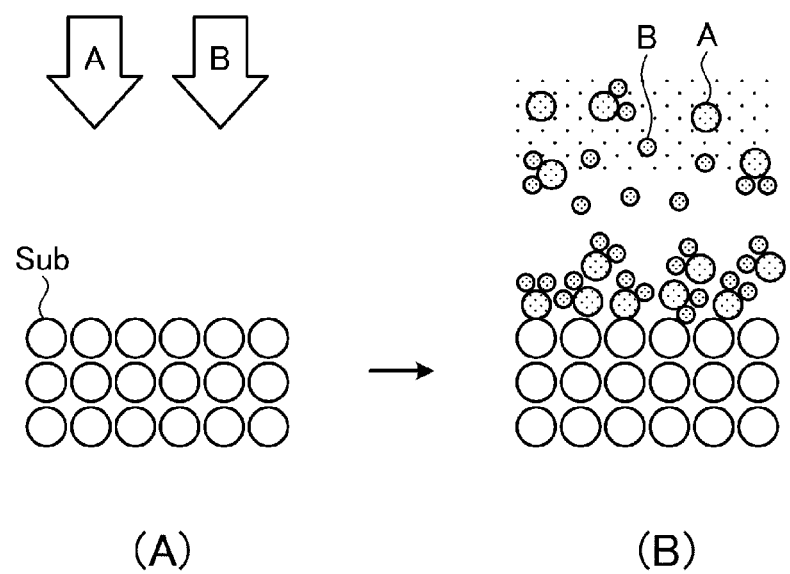
FIG. 4 is a view illustrating a chemical vapor deposition.

FIG. 4 is a view illustrating the CVD. In the CVD, gases containing components that react with each other to form a film are introduced into the chamber in which the substrate is placed, and a film is formed on the substrate by the reaction. In the example of FIG. 4, gases A and B are simultaneously introduced into the chamber in which a substrate Sub ((A) of FIG. 4) is placed. The reactive species of the introduced gas A and the reactive species of the introduced gas B react with each other to form a film on the substrate Sub ((B) of FIG. 4). The components of the film that have reacted with each other in the gas phase state are deposited from above. Accordingly, when a pattern having a height difference exists on the substrate, the coverage of the film formed by the CVD decreases from the upper portion toward the lower portion of the pattern.

Figure 5:
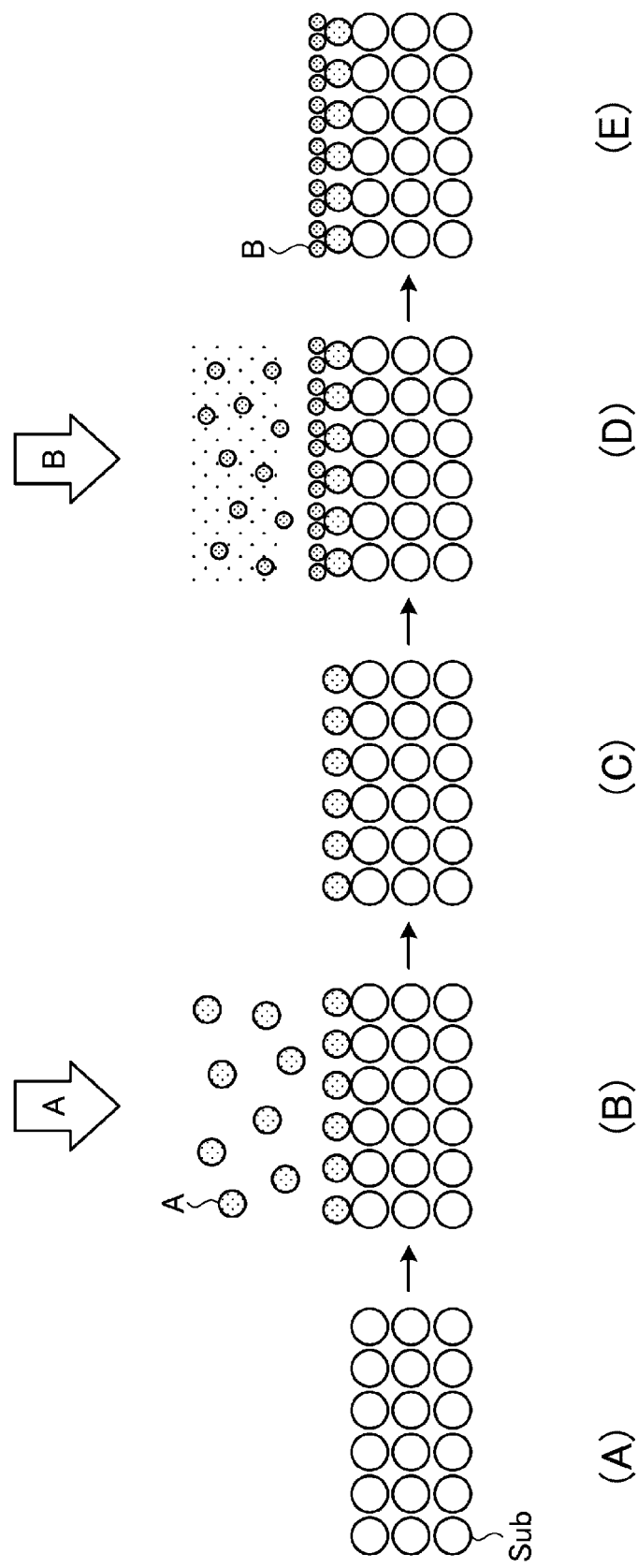
FIG. 5 is a view illustrating an atomic layer deposition.

FIG. 5 is a view illustrating the ALD. In the ALD, a film is formed by sequentially introducing the first reactive species and the second reactive species into the chamber in which the substrate is placed. In the example of FIG. 5, the gas A (the first reactive species) is first introduced into the chamber in which the substrate Sub ((A) of FIG. 5) is placed ((B) of FIG. 5). The molecules of the gas A are adsorbed onto the surface of the substrate Sub ((C) of FIG. 5). When there is no more site onto which the molecules of the gas A are to be adsorbed, the molecules of the gas A are no longer deposited on the substrate Sub. The gas A remaining in the chamber is purged. Subsequently, the gas B (the second reactive species) is introduced into the chamber ((D) of FIG. 5). At this time, plasma may be generated from the gas B to promote the reaction. The molecules or radicals of the gas B react with the molecules adsorbed onto the substrate Sub to form a film. At this time, when all of the molecules of the gas A on the substrate Sub react with the molecules of the gas B, the remaining molecules of the gas B reside in the gas phase state in the chamber. Then, the residing gas B is purged ((E) of FIG. 5). In this way, in the ALD, the film is formed by performing the four steps of adsorption, purging, reaction (e.g., oxidation), and purging. Since the ALD implements the film formation in the self-controlled manner, the coverage of the film formed by the ALD implements the substantially uniform film thickness over the upper portion to the lower portion of the pattern.

Figure 6:
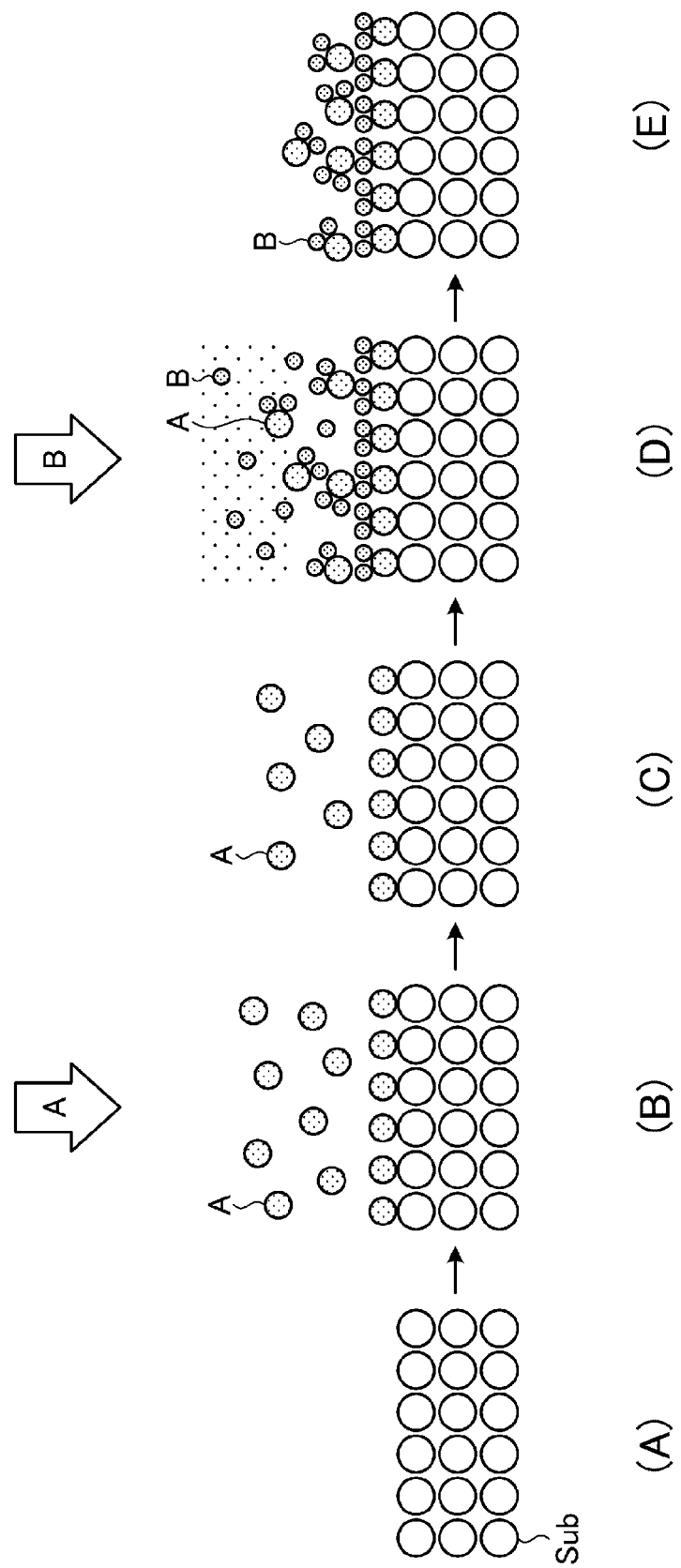
FIG. 6 is a view illustrating a mix mode in the first embodiment.

FIG. 6 is a view illustrating the mix mode in the first embodiment. In the first embodiment, the "mix mode" refers to causing the reaction between the first reactive species A and the second reactive species B in the gas phase state as in the CVD, while using the same processing flow as that in the ALD, in other words, refers to a film forming method in which the ALD and the CVD are combined with each other.

In the example of FIG. 6, first, the gas A (the first reactive species) is introduced into the chamber in which the substrate Sub ((A) of FIG. 6) is placed. The molecules of the introduced gas A are adsorbed onto the substrate Sub ((B) of FIG. 6). In the mix mode, the gas A is not completely purged from the chamber after the molecules of the gas A are adsorbed onto the substrate Sub ((C) of FIG. 6). Then, the gas B (the second reactive species) is introduced into the chamber in which the gas A remains ((D) of FIG. 6). The molecules of the gas B react with the molecules of the gas A adsorbed onto the substrate Sub, and simultaneously, react with the molecules of the gas A that exist in the gas phase state in the chamber, so as to form a film. As a result, in addition to the film formed in the self-controlled manner in the ALD, the film having the same coverage as that in the CVD is formed ((E) of FIG. 6). The gas A is, for example, a silicon-containing gas. The gas B is, for example, an oxygen-containing gas. Further, for example, a carbon-containing gas may be used as the gas A. Further, for example, a nitrogen-containing gas may be used as the gas B.

In the film formation by the mix mode, the coverage may be changed by adjusting the amount of the first reactive species that remain in the chamber (hereinafter, also referred to as the residence amount) when the second reactive species is introduced into the chamber. The coverage in the mix mode may be adjusted by the following processing conditions:

(1) Processing time for the step of purging the first reactive species (step (C) of FIG. 6)

(2) Pressure in the chamber in the step of purging the first reactive species (3) Flow rate of a purging gas used for the step of purging the first reactive species (4) Dilution degree of the first reactive species (step (B) of FIG. 6)

Here, the time required to replace a gas in the chamber (hereinafter, also referred to as the residence time) may be expressed by the following equation:

$$T = (P \times V)/(Q) \tag{1}$$

In the equation, the symbol "T" refers to the residence time (second), that is, the time during which a gas resides in the processing space (the chamber). The symbol "P" refers to the pressure (Torr) in the processing space. The symbol "V" refers to the volume (liter) of the processing space. The symbol "Q" refers to the flow rate (sccm) of the gas. As seen from the equation (1), the residence time T is proportional to the volume of the processing space and the pressure in the processing space, and is inversely proportional to the flow rate of a gas. Accordingly, as the volume of the processing space is relatively large, and the pressure in the processing space is relatively high, the residence time becomes relatively long. Further, as the flow rate of a gas is relatively large, the residence time becomes relatively short.

Accordingly, the amount of the first reactive species that remains in the chamber may be increased when the second reactive species is introduced into the chamber, by adjusting the processing conditions as follows:

(1) Reduce the processing time for the step of purging the first reactive species (e.g., making the processing time shorter than the residence time)

(2) Increase the pressure in the chamber during the step of purging the first reactive species (3) Reduce the flow rate of the purging gas used for the step of purging the first reactive species In a case where the processing conditions for the step of purging the first reactive species are not changed, the residence amount of the first reactive species may also be increased by increasing the dilution degree of the first reactive species (the processing condition (4) above) so as to increase the amount of the reactive molecules that reside without being adsorbed onto the substrate. Further, the residence amount of the first reactive species may be maintained by not performing the purging step.

As described above, in the substrate processing method according to the first embodiment, the film formation processings that implement different coverages are combined with each other, so that the continuous coverage control is implemented.

(Example of Configuration of Substrate Processing Apparatus)

Figure 7:
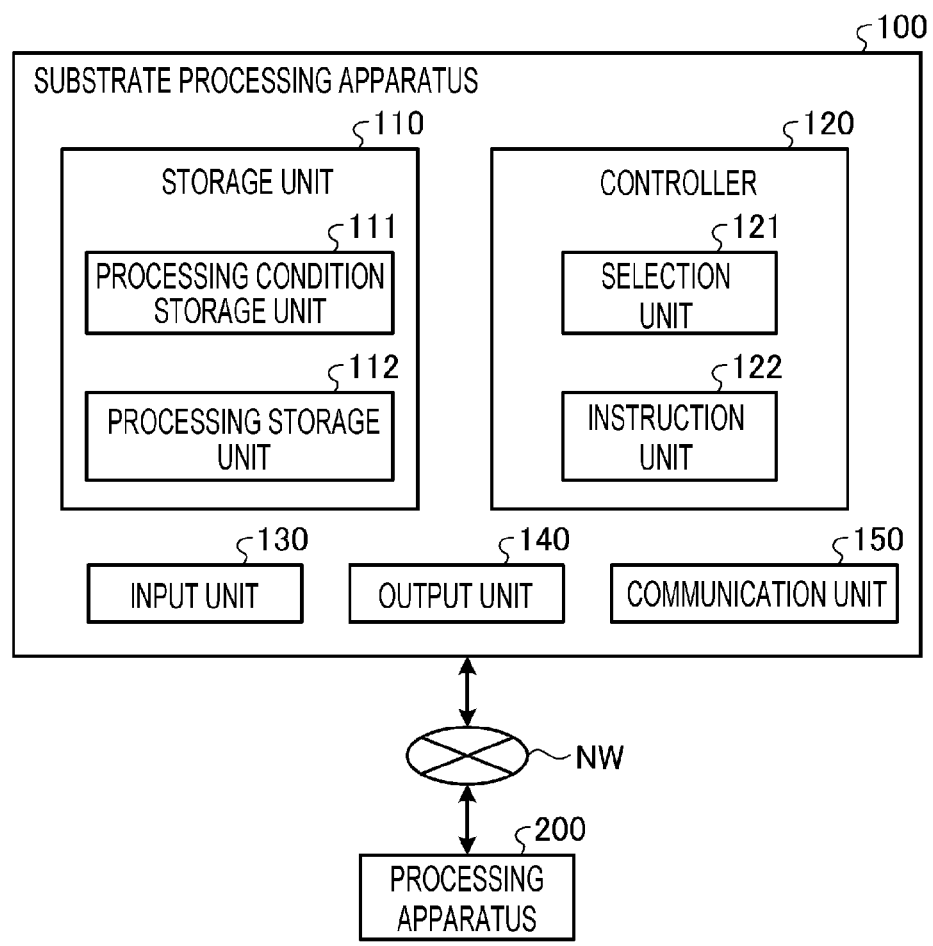
FIG. 7 is a view illustrating an example of a configuration of a substrate processing apparatus according to the first embodiment.

FIG. 7 is a view illustrating an example of a configuration of a substrate processing apparatus 100 according to the first embodiment. The substrate processing apparatus 100 may be configured by an information processing apparatus such as, for example, a personal computer (PC). The substrate processing apparatus 100 is connected to a processing apparatus 200 via a network NW.

The network NW may be, for example, the Internet, an intranet, a local area network, a wide area network or a combination thereof. Further, the network NW may be a wired network, a wireless network or a combination thereof.

The processing apparatus 200 includes the processing space (the chamber) where a processing is performed on the substrate, and performs the processing on the substrate. The details of the processing apparatus 200 will be described later. The configuration and the type of the processing apparatus 200 are not particularly limited. The processing apparatus 200 may be, for example, any plasma processing apparatus using a plasma source such as, for example, capacitively coupled plasma (CCP), inductively coupled plasma (ICP) or microwave plasma. The processing apparatus 200 performs, for example, the film formation such as the atomic layer deposition (ALD) or the chemical vapor deposition (CVD), and the etching. The processing apparatus 200 may or may not use plasma for the processing on the substrate.

The substrate processing apparatus 100 includes a storage unit 110, a controller 120, an input unit 130, an output unit 140, and a communication unit 150.

The storage unit 110 stores information used for a processing in the substrate processing apparatus 100 and information generated as a result of the processing. Examples of the storage unit 110 include a flash memory, a random access memory (RAM), a read only memory (ROM), a hard disk, and an optical storage device.

The controller 120 controls the operation and the functions of the substrate processing apparatus 100. The controller 120 is, for example, an integrated circuit or an electronic circuit. Examples of the controller 120 include a central processing unit (CPU) and a micro processing unit (MPU).

The input unit 130 receives an input of information from the outside to the substrate processing apparatus 100. Examples of the input unit 130 include a touch panel, a mouse, a keyboard, a microphone, and peripheral circuits thereof The output unit 140 outputs information from the substrate processing apparatus 100. Examples of the output unit 140 include a screen, a speaker, a printer, and peripheral circuits thereof.

The communication unit 150 implements a communication with other devices through the network NW. Examples of the communication unit 150 include a modem, a port, a router, and a switch.

(Information Stored in Storage Unit 110)

The storage unit 110 includes a processing condition storage unit 111 and a processing storage unit 112.

The processing condition storage unit 111 stores processing conditions for processings performed on the substrate in the processing apparatus 200, for example, the film formation and the etching.

FIG. 8 is a view illustrating an example of the processing conditions stored in the substrate processing apparatus 100 according to the first embodiment. The processing conditions are, for example, the processing conditions for each film formation processing described above with reference to FIGS. 4 to 6. For example, in the CVD, the processing conditions include, for example, the pressure in the chamber, the frequency and the power of the radio frequency HP applied when plasma is generated, the type of a gas introduced into the chamber, and the flow rate (ratio) of the gas. The processing conditions also include the processing time and a set temperature of each unit of the chamber. In the ALD and the mix mode, the processing conditions may be set for each of the step of adsorbing the first reactive species (step a1), the step of pursing the first reactive species (step a2), and the step of causing the reaction of the second reactive species (step b1), and the step of purging the second reactive species (step b2). FIG. 2B illustrates the steps a1, a2, b1, and b2.

In the example of FIG. 8, the processing conditions include "Condition ID (Identifier)," "Step No." "Pressure," "Radio Frequency (HP)," "Gas," "Flow Rate," "Processing Time," and "Temperature." "Condition ID" represents an identifier that uniquely identifies each processing condition. "Step No." represents a number that identifies each step when one processing includes a plurality of steps. "Pressure" represents a pressure value in the chamber during the processing. "Radio Frequency (HP)" represents the frequency and the power of a radio frequency applied to an electrode in the chamber during the processing. "Gas" represents information that specifies a gas to be introduced into the chamber during the processing. "Flow Rate" represents the flow rate of the corresponding gas. "Processing Time" represents the time for the processing. "Temperature" represents the temperature of a predetermined unit of the chamber that is set when the processing is performed.

For example, in FIG. 8, Step Nos. "1" to "4" are stored in the processing condition identified by "Condition ID: P100." This indicates that the processing condition specified by Condition ID "P100" includes four steps. Further, "Pressure: XXmT," "Gas: X/Y," "Flow Rate: R1/R2," "Processing Time: 2 sec," and "Temperature: T1/T2/T3" are stored in association with "Step No.: 1." This indicates that the pressure of the chamber is set to XXmT during the step specified by Step No. "1" in the processing condition of Condition ID "P100." Further, it indicates that an X gas (an unspecified gas here) and a Y gas are supplied into the chamber at the flow rate ratio of R1 sccm to R2 sccm in the step. Further, it indicates that the processing time of the step is 2 seconds. Further, it indicates that the temperature of a predetermined unit of the chamber is set to T1 ° C., T2 ° C., and T3 ° C. during the performance of the step.

In FIG. 8, the processing condition represented by Condition ID "P100" corresponds to the ALD. In the processing condition of Condition ID "P100," Step No. "1" represents the processing condition of the adsorption step (step a1), and Step No. "2" represents the processing condition of the purging step (step a2) after the adsorption step. Step No. "3" represents the processing condition of the reaction step (step b1), and Step No. "4" represents the processing condition of the purging step (step b2) after the reaction step. In FIG. 8, the processing condition represented by Condition ID "P200" corresponds to the CVD (see step SA1 of FIG. 2A). Since the processing of Condition ID "P200" includes one step, only the processing condition of Step No. "1" is stored. In FIG. 8, the processing conditions represented by Condition IDs "P301" to "P303" correspond to the mix mode. The processing conditions of Condition IDs "P301" to "P303" are substantially similar to the processing condition of Condition ID "P100," except for the "Processing Time" of Step No. "2." This is because the processing conditions of Condition IDs "P301" to "P303" set the processing time of the purging step (step a2) to be relatively short, in order to implement the mix mode.

The processing storage unit 112 stores a processing which is a combination of the processing conditions stored in the processing condition storage unit 111.

FIG. 9 is a view illustrating an example of the processings stored in the substrate processing apparatus 100 according to the first embodiment. In the example of FIG. 9, each processing includes "Processing ID," "Number of Cycles," and "Condition ID/Procedure." "Processing ID" represents an identifier that uniquely identifies a processing. "Number of Cycles" represents the number of times of preforming the processing based on a processing condition that corresponds to the processing. "Condition ID/Procedure" represents a processing condition for performing the processing, and the procedure of performing the processing when a plurality of processings is performed. Further, "Condition ID/Procedure" may be information about a processing ID and a procedure, instead of the condition ID and the procedure.

For example, in the example of FIG. 9, "Number of Cycles: 1" and "Condition ID/Procedure: P200" are stored in association with "Processing ID: S001." This indicates that the processing specified by Processing ID "S001" is performed once based on the processing condition specified by Condition ID "P200." The processing condition specified by Condition ID "P200" is stored in the processing condition storage unit 111. That is, the processing condition of Condition ID "P200" represents the chamber pressure "XXmT," the radio frequency HP "Z1MHz/Z2W," the gas "X/Y," and the flow rate "R1/R2." The processing time is "10 sec," and the temperature is "T1/T2/T3."

For example, in the example of FIG. 9, "Number of Cycles: 5" and Condition ID/Procedure: S001→S003→S100" are stored in association with Processing ID "S500." This indicates that for the processing specified by Processing ID "S500," processings specified by Processing IDs "S001," "S003," and "S100," respectively, are performed in this order. Further, it indicates that the three processings are repeated five times in an order. The processing specified by Processing ID "S001" is the CVD, and the processing specified by Processing ID "S003" is the mix mode (see FIG. 8). When the processing specified by Processing ID "S100" is the etching, Processing ID "S500" represents that the CVD, the ALD, and the etching are continuously and repeatedly performed five times.

(Configuration and Functions of Controller 120)

Referring back to FIG. 7, the configuration and the functions of the controller 120 will be described. The controller 120 includes a selection unit 121 and an instruction unit 122.

The selection unit 121 receives an instruction input through the input unit 130 or the communication unit 150. Then, the selection unit 121 selects one or more processings that correspond to the received instruction, from the storage unit 110 (step S11 of FIG. 1). The selection unit 121 sends the selected processings to the instruction unit 122.

The instruction unit 122 instructs the processing apparatus 200 to perform processings based on the processings selected by the selection unit 121 (step S12 of FIG. 1).

(Experimental Examples)

Figure 10:
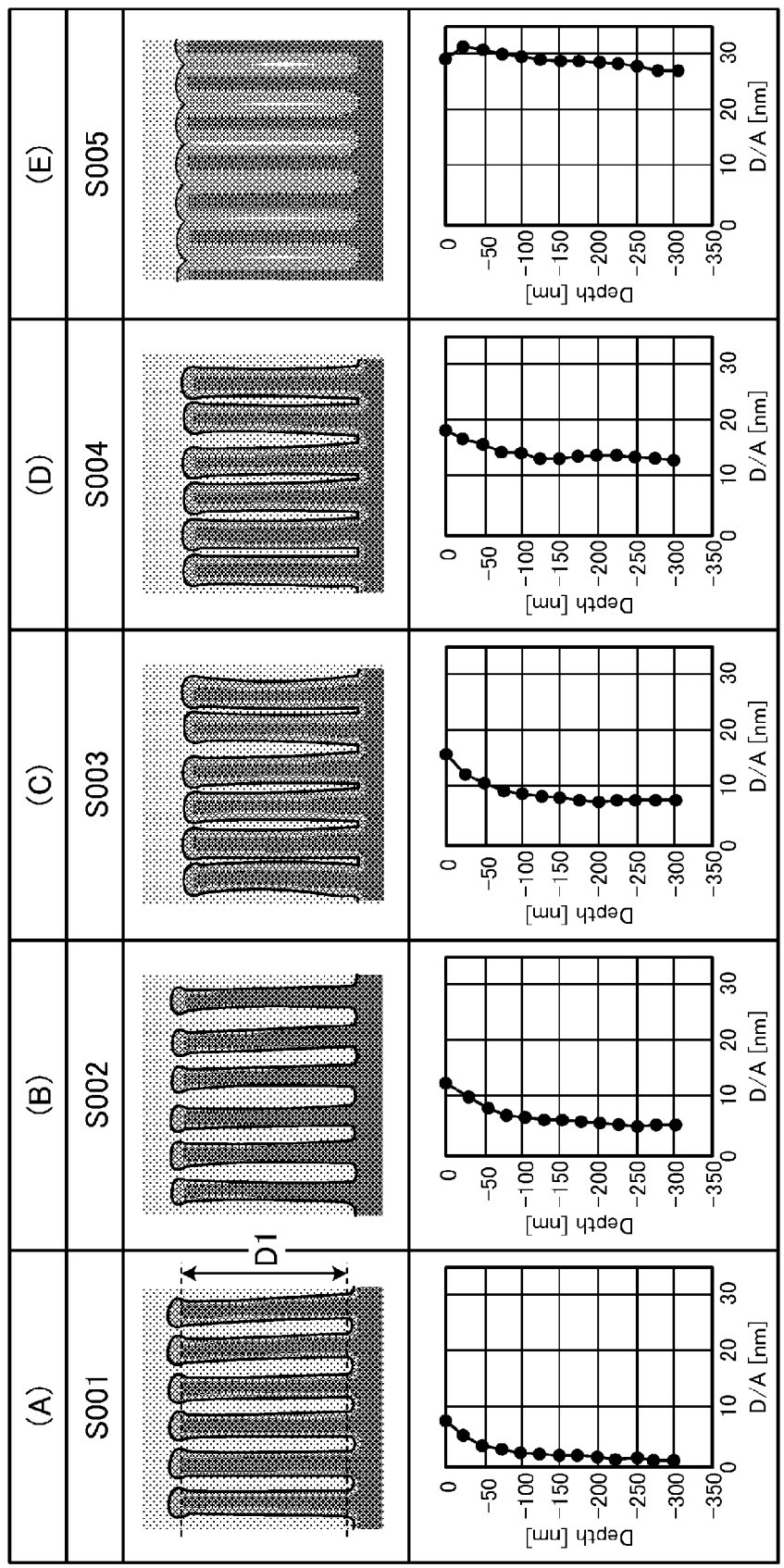
FIG. 10 is a view illustrating experimental results of the processings based on the substrate processing method according to the first embodiment.

FIG. 10 is a view illustrating experimental results of processings based on the substrate processing method according to the first embodiment. In FIG. 10, (A) illustrates a coverage obtained when the CVD is performed once for 10 seconds based on Processing ID "S001" (see FIGS. 8 and 9). In FIG. 10, (B) illustrates a coverage obtained when the processing based on Processing ID "S002" (see FIGS. 8 and 9) in which the purging time in the mix mode is set to 0.5 seconds is performed 40 times. In FIG. 10, (C) illustrates a coverage obtained when the processing based on Processing ID "S003" (see FIGS. 8 and 9) in which the purging time in the mix mode is set to 0.7 seconds is performed 70 times. In FIG. 10, (D) illustrates a coverage obtained when the processing based on Processing ID "S004" (see FIGS. 8 and 9) in which the purging time in the mix mode is set to 1 second is performed 105 times. In FIG. 10, (E) illustrates a coverage obtained when the ALD is performed 200 times based on Processing ID "S005" (see FIGS. 8 and 9).

The processing conditions of Condition IDs "P301," "P302," "P303," and "P100" are different from each other only in length of the time for purging the first reactive species. In FIG. 10, the purging time is 0.5 seconds for (B), 0.7 seconds for (C), 1 second for (D), and 10 seconds for (E), which gradually increase from (B) toward (E). Thus, the residence amount of the first reactive species (an X-containing gas in the example of FIG. 10) when the second reactive species (an oxygen-containing gas in the example of FIG. 10) is introduced into the chamber decreases from (B) toward (E). Thus, it is understood that the film formation amount in the CVD method is the largest in (B), and decreases from (C) toward (D). Further, it is understood that the film formation of the ALD method is implemented in (E).

In the example of (A) of FIG. 10, the film is generally formed on the top portion of the pattern, and is not substantially formed on the lower portion of the pattern. That is, the coverage that corresponds to (1) of FIG. 3B is implemented under the processing condition of (A) of FIG. 10.

In the example of (B) of FIG. 10, the film thickness gradually decreases from the upper portion toward the lower portion of the pattern, and the film is not substantially formed on the lower portion of the pattern. That is, the coverage that substantially corresponds to (2) of FIG. 3B is implemented under the processing condition of (B) of FIG. 10.

In the example of (C) of FIG. 10, the film thickness of the formed film becomes larger as a whole than (B), and decreases from the upper portion toward the lower portion of the pattern as in (B). That is, it may be said that (C) of FIG. 10 generally corresponds to (3) of FIG. 3B.

In the example of (D) of FIG. 10, the film thickness of the formed film becomes further larger than (C), and the film is also formed at the bottom of the pattern. It may be said that (D) of FIG. 10 implements the coverage that substantially corresponds to (4) of FIG. 3B.

In the example of (E) of FIG. 10, the film thickness of the formed film has no substantial difference between the upper portion and the lower portion of the pattern, and a substantially uniform film is formed. That is, the coverage that corresponds to (5) of FIG. 3B is implemented under the processing condition of (E) of FIG. 10.

In the graphs of FIG. 10, the "Depth" represents a distance (dimension) from the upper end to the lower end of the film formed on the side wall. That is, the "Depth" represents a dimension that does not include the top and the bottom (corresponding to the dimension indicated by D1 in FIG. 10). The "D/A" represents the thickness of the film formed on the side wall.

Figure 11:
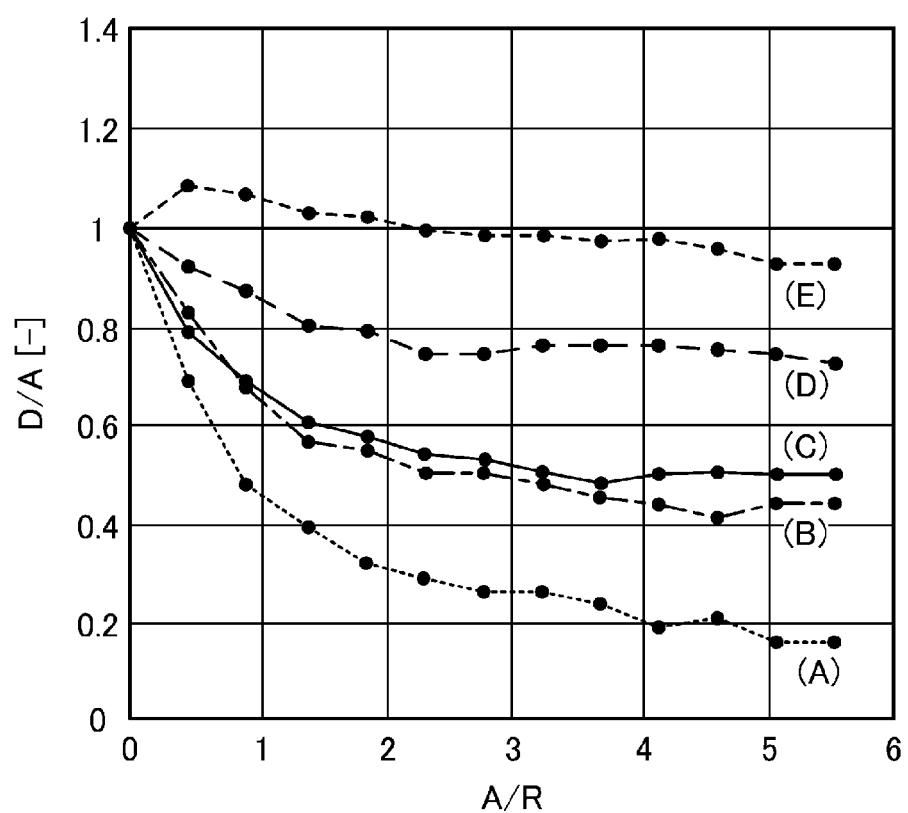
FIG. 11 is a graph obtained by normalizing each of the experimental results illustrated in FIG. 10.

FIG. 11 represents graphs obtained by normalizing the experimental results illustrated in FIG. 10. As seen from FIG. 11, the coverage gradually changes from (A) through (E), and an intermediate film forming method between the CVD and the ALD is implemented. Thus, according to the substrate processing method of the first embodiment, the film formation with a desired coverage may be implemented by continuously changing the coverage.

In the ALD, a conformal film may not be necessarily formed. For example, the adsorption position of the first reactive species may be limited to the upper portion of the pattern, such that the film is formed only on the upper portion of the pattern. Further, the processing may be terminated before the second reactive species reaches the bottom of the pattern, such that the film is formed only on the upper portion of the pattern. The coverage may be more flexibly controlled by using a subconformal ALD.

(Effects of First Embodiment)

As described above, the substrate processing method according to the first embodiment includes steps "a," "b," and "c." Step "a" exposes the substrate with a pattern formed on the surface thereof to the first reactive species in the chamber, so as to absorb the first reactive species onto the surface of the substrate. Step "b" exposes the substrate to plasma formed from the second reactive species in the chamber, so as to form a film on the surface of the substrate. Step "c" repeats the processing including steps "a" and "b" two or more times by changing the residence amount of the first reactive species at the time of starting step "b." As a result, according to the substrate processing method of the first embodiment, the coverage of the film formed on the substrate may be continuously controlled. For example, as the residence amount of the first reactive species at the time of starting step "b" is relatively large, the thickness of the film formed on the upper portion of the pattern becomes thicker than the thickness of the film formed on the lower portion of the pattern. Meanwhile, as the residence amount of the first reactive species at the time of starting step "b" is relatively small, the thickness of the film formed on the upper portion of the pattern becomes similar to the thickness of the film formed on the lower portion of the pattern. As a result, according to the substrate processing method of the first embodiment, the coverage of the film formed on the substrate may be continuously controlled depending on the residence amount of the first reaction species at the time of starting step "b."

In the substrate processing method according to the first embodiment, the residence amount of the first reactive species at the time of starting step "b" may be changed by controlling the amount of the first reactive species introduced into the chamber in step "a." Further, in the substrate processing method according to the first embodiment, the residence amount of the first reactive species at the time of starting step "b" may be changed by controlling the dilution degree of the first reactive species introduced into the chamber in step "a." As a result, according to the first embodiment, the coverage of the film formed on the substrate may be easily controlled by adjusting the amount or the dilution degree of the first reactive species.

In the substrate processing method according to the first embodiment, step "a" may include step a1 of introducing the first reactive species into the chamber, and step a2 of purging at least a portion of the first reactive species from the chamber. In the substrate processing method according to the first embodiment, the residence amount of the first reactive species at the time of starting step "b" may be changed by controlling the amount of the first reactive species purged in step a2. As a result, according to the first embodiment, the amount of the first reactive species in the chamber may be adjusted in the purging step. As a result, according to the first embodiment, the coverage of the film formed on the substrate may be continuously controlled by simply adjusting the processing condition. Further, according to the first embodiment, an intermediate film forming method between the ALD and the CVD may be easily implemented by changing the processing condition of the purging step.

In the substrate processing method according to the first embodiment, the amount of the first reactive species at the time of starting step "b" may be changed by changing the residence amount of the first reactive species purged in step a2 in the manner of changing at least one of the pressure in the chamber, the processing time, and the flow rate of the purging gas. As a result, according to the first embodiment, the coverage of the film formed on the substrate may be controlled by selecting and adjusting an easily controllable condition among the plurality of processing conditions In the substrate processing method according to the first embodiment, step "a" or "b" may be terminated before the reaction on the substrate surface is saturated. As a result, in the substrate processing method according to the first embodiment, the coverage of the film formed on the substrate may be further finely adjusted by using the subconformal ALD.

In the substrate processing method according to the first embodiment may further include step "d" of etching the substrate using the film formed in step "c" as a mask (protective film), after step "c." In the substrate processing method according to the first embodiment, step "c" may be repeatedly performed until the shape of the pattern satisfies a predetermined condition. The substrate processing method according to the first embodiment may further include step "e" of repeatedly performing a processing including steps "c" and "d" two or more times. As a result, according to the first embodiment, the etching may be performed after the shape of the mask is corrected by continuously controlling the coverage. As a result, according to the first embodiment, the etching accuracy may be improved. Further, according to the first embodiment, the etching may be performed while correcting the shape of the mask.

In the substrate processing method according to the first embodiment, step "c" may be performed in the same chamber. As a result, according to the first embodiment, the throughput of the processing may be further improved. When the substrate processing method according to the first embodiment includes step "d," steps "c" and "d" may be performed in the same chamber or in different chambers. As a result, according to the first embodiment, the entire substrate processing may be optimized while balancing the film formation time and the etching time.

In the substrate processing method according to the first embodiment, step "c" may be performed by setting the pressure in the chamber to about 10 mTorr to about 200 mTorr. While the residence time is reduced when the pressure is set to be relatively low, the mix mode according to the first embodiment may be implemented by adjusting the other processing conditions. As a result, according to the first embodiment, the throughput of the substrate processing may be improved while suppressing the increase in processing time.

The substrate processing apparatus according to the first embodiment includes the selection unit and the instruction unit. The selection unit selects a plurality of processings. The processing includes, for example, steps "a," "b," and "c." Step "a" exposes the substrate with a pattern formed on the surface thereof to the first reactive species in the chamber, so as to absorb the first reactive species onto the surface of the substrate. Step "b" exposes the substrate to plasma formed from the second reactive species in the chamber, so as to form a film on the surface of the substrate. Step "c" repeats the processing including steps "a" and "b" two or more times while changing the residence amount of the first reactive species at the time of starting step "b." In step "c," the plurality of processings selected by the selection unit are different from each other in residence amount of the first reactive species at the time of starting step "b." The instruction unit instructs the performance of the plurality of processings selected by the selection unit in the chamber. As a result, according to the substrate processing apparatus of the first embodiment, the coverage of the film formed on the substrate may be continuously controlled.

Second Embodiment

In the substrate processing apparatus according to the first embodiment, the processing conditions are set in advance, and a processing is selected in accordance with the coverage desired to be achieved. In a substrate processing apparatus according to a second embodiment, a processing is selected and performed in accordance with the state of the pattern on the substrate. In a substrate processing method according to the second embodiment, a processing is selected and performed in accordance with, for example, a degree of roughness of a pattern on the substrate.

Figure 12:
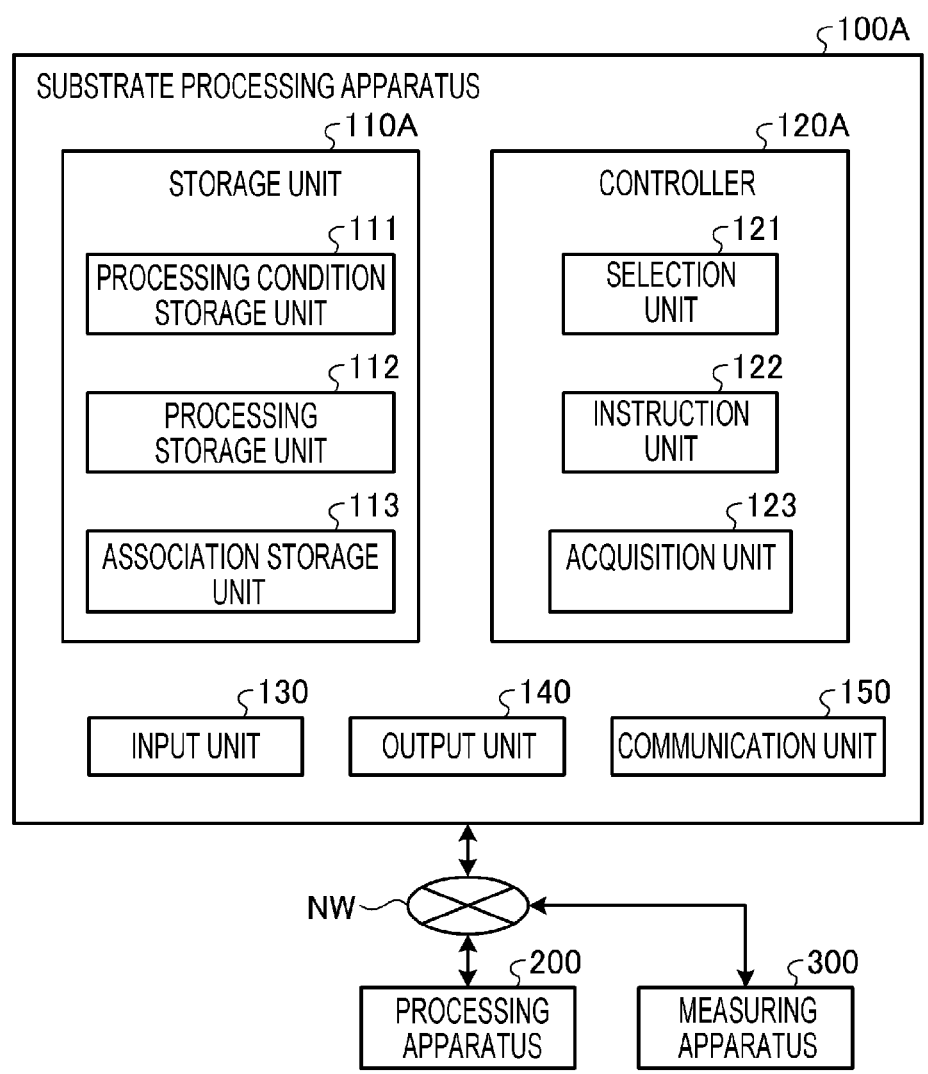
FIG. 12 is a view illustrating an example of a configuration of a substrate processing apparatus according to a second embodiment.

FIG. 12 is a view illustrating an example of a configuration of a substrate processing apparatus 100A according to the second embodiment. The configuration of the substrate processing apparatus 100A according to the second embodiment is substantially similar to that of the substrate processing apparatus 100 according to the first embodiment. The substrate processing apparatus 100A is different from the substrate processing apparatus 100 in that the substrate processing apparatus 100A includes an association storage unit 113 and an acquisition unit 123. Further, the substrate processing apparatus 100A is different from the substrate processing apparatus 100 in that the substrate processing apparatus 100A is connected for communication to a measuring apparatus 300 via the network NW. Among the components of the substrate processing apparatus 100A, the components similar to those of the substrate processing apparatus 100 will not be described, and the different components will be described below.

The substrate processing apparatus 100A is connected for communication to the processing apparatus 200 and the measuring apparatus 300 via the network NW. The network NW and the processing apparatus 200 are similar to the network NW and the processing apparatus 200 of the first embodiment (see FIG. 7).

The measuring apparatus 300 measures the shape of the pattern formed on the substrate, and outputs a value that represents the shape. The value output by the measuring apparatus 300 may be referred to as a measured value. The type of the measured value that is output by the measuring apparatus 300 is not particularly limited. The measured value may be, for example, an aspect ratio of the pattern formed on the substrate. The measured value may be, for example, a standard deviation of a signal waveform that represents the unevenness of the pattern formed on the substrate. The measured value may be, for example, a power spectral density (PSD) of the signal waveform that represents the unevenness of the pattern formed on the substrate. Since the same standard deviation may be obtained even when the period of unevenness is entirely different, it may be preferable to use the power spectral density as the measured value in order to improve the measurement accuracy (see "Reducing Roughness in Extreme Ultra Violet Lithography," Chris A. Mack, Journal of Micro/Nanolithography, MEMS and MOEMS, 17(4), 041006(2018)). In the second embodiment, the measured value may include at least the aspect ratio and the power spectral density.

For example, the measuring apparatus 300 may be an apparatus that derives, for example, the standard deviation and the power spectral density of the pattern shape based on information and images obtained by analyzing the pattern formed on the substrate using a scanning electron microscope (SEM). In the example of FIG. 12, it is assumed that the substrate processing apparatus 100A and the measuring apparatus 300 are connected to each other through the network NW. The measuring apparatus 300 may not be connected to the substrate processing apparatus 100A, and a measured value separately derived by an operator or the like may be input to the substrate processing apparatus 100A.

The substrate processing apparatus 100A includes a storage unit 110A, a controller 120A, an input unit 130, an output unit 140, and a communication unit 150.

The storage unit 110A includes the association storage unit 113, in addition to the processing condition storage unit 111 and the processing storage unit 112 which are similar to those in the first embodiment. The association storage unit 113 stores an association between the measured value that is input from the measuring apparatus 300, and a processing.

FIG. 13 is a view illustrating an example of a configuration of information stored in the association storage unit 113. In the example of FIG. 13, the association storage unit 113 stores "Device ID," "Measured Value: Aspect Ratio, PSD," and "Processing ID." "Device ID" represents information that specifies a device formed by a processing. Further, "Device ID" may be information that represents an aspect ratio and a target value of PSD. "Measured Value: Aspect Ratio" represents an aspect ratio of a pattern that is obtained by measuring a pattern formed on the substrate. "Measured Value: PSD" represents a power spectral density of a pattern that is obtained by measuring a pattern formed on the substrate. "Processing ID" represents a processing applied to a pattern of a corresponding "Measured Value" in order to achieve a corresponding "Device ID."

Figure 14A:
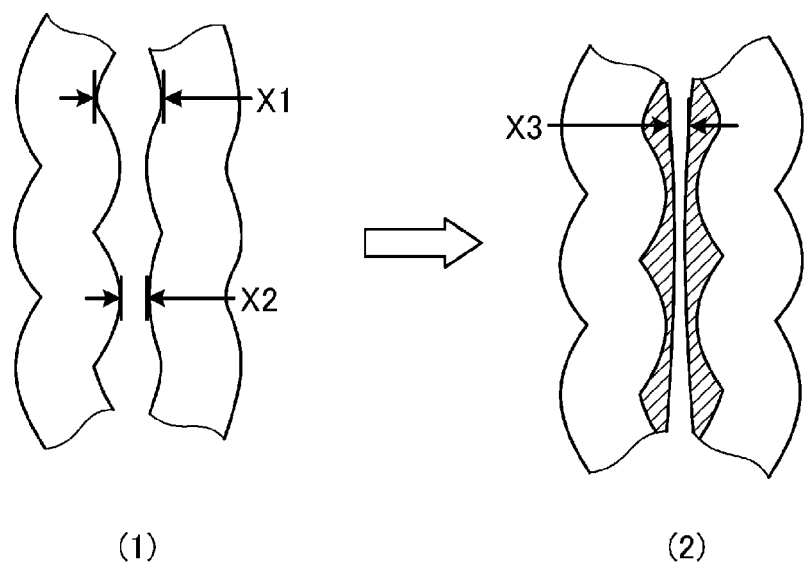
FIG. 14A is a view illustrating an example of a low frequency roughness of a pattern formed on a substrate.
Figure 14B:
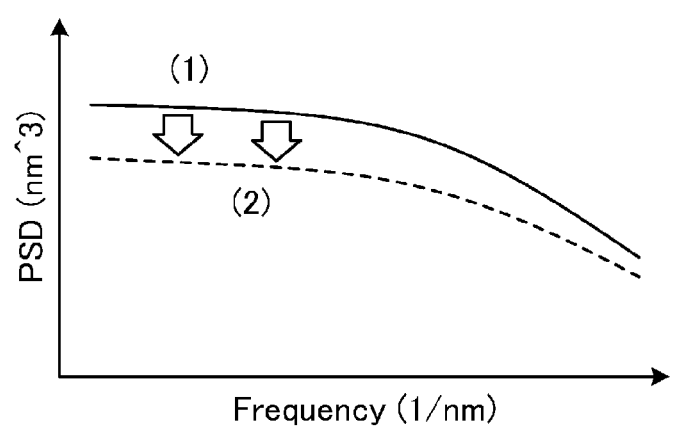
FIG. 14B is a view illustrating an example of a power spectral density obtained by measuring the pattern formed on the substrate.

FIGS. 14A to 14D are views illustrating a relationship between the power spectral density and the pattern shape. FIG. 14A is a view illustrating an example of a low frequency roughness of a pattern formed on the substrate. FIG. 14B is a view illustrating an example of the power spectral density obtained by measuring the pattern formed on the substrate.

Here, the low frequency roughness refers to a roughness, that is, unevenness that occurs in a relatively large period, as compared with a high frequency roughness, and the high frequency roughness refers to a roughness that occurs in a relatively small period, as compared with the low frequency roughness.

In FIG. 14A, (1) illustrates a state where an unevenness occurs in a wave shape in a line-and-space pattern that is originally formed in a linear shape. FIG. 14A is a view of the pattern when viewed from top to bottom. In the example of (1) of FIG. 14A, the space between lines differs in X1 and X2. The power spectral density obtained by measuring the pattern of (1) of FIG. 14A may be represented as illustrated in (1) of FIG. 14B. In the graph of FIG. 14B, the horizontal axis represents the frequency (unit: nanometer [nm]), and the vertical axis represents the power spectral density (unit: $nm^3$), in other words, the magnitude of energy in each frequency band. In the graph of FIG. 14B, the roughness that occurs in a relatively small period, that is, the high frequency roughness increases toward the right side of the horizontal axis, and the roughness that occurs in a relatively large period, that is, the low frequency roughness increases toward the left side of the horizontal axis.

Here, the roughness of the pattern of (1) in FIG. 14A is improved by flattening the unevenness ((2) of FIG. 14A). In the example of (2) of FIG. 14A, the space between lines becomes uniform, and the portion X1 in (1) becomes the space X3 that is substantially equal to the other portions. Then, the shape of the graph of the power spectral density also changes. In FIG. 14B, (2) is an example of the power spectral density obtained by measuring the pattern with the improved roughness. In FIG. 14B, (2) represents that the low frequency roughness, that is, the roughness that occurs in a relatively large period is improved, and the pattern surface is flattened.

Figure 14C:
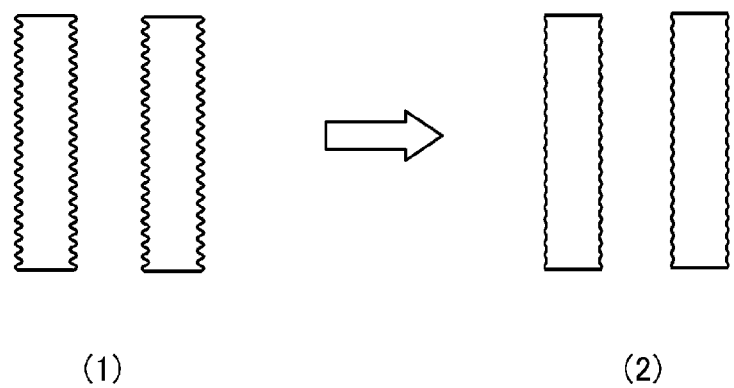
FIG. 14C is a view illustrating an example of a high frequency roughness of a pattern formed on the substrate.
Figure 14D:
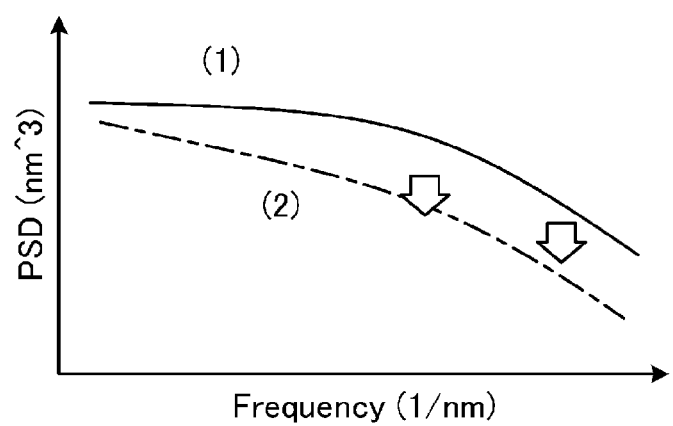
FIG. 14D is a view illustrating another example of the power spectral density obtained by measuring the pattern formed on the substrate.

FIG. 14C is a view illustrating an example of the high frequency roughness of the pattern formed on the substrate. FIG. 14D is a view illustrating another example of the power spectral density obtained by measuring the pattern formed on the substrate.

In FIG. 14D, (1) represents the pattern with the high frequency roughness illustrated in (1) of FIG. 14C, using the power spectral density. At this time, the roughness of the pattern of (1) in FIG. 14C is improved by flattening the unevenness ((2) of FIG. 14C). Then, the shape of the graph changes as illustrated in (2) of FIG. 14D. Form (2) of FIG. 14D, it may be understood that the high frequency roughness is improved, as compared with the low frequency roughness, and the pattern surface is flattened.

The low frequency roughness illustrated in FIG. 14B may be flattened by, for example, the CVD. Since the film formed by the CVD tends to be deposited in a relatively large void, the film fills up a concave portion having a relatively large low frequency roughness.

In the high frequency roughness illustrated in FIG. 14D, the size of the concave portion that causes the roughness is relatively small in view of the entire pattern. Thus, the concave portion may not be preferentially filled up in the film formation by the CVD. Accordingly, in order to improve the high frequency roughness, it is preferable to use the mix mode in which the ALD and the CVD are combined with each other.

In the substrate processing method according to the second embodiment, the shape of the pattern on the substrate to be processed such as the roughness is measured before a processing is performed, and a processing condition to be adopted, that is, a processing is selected according to the measured value. As a result, a processing may be selected in accordance with a shape abnormality that occurs in the pattern on the substrate, and the pattern shape may be corrected.

In the descriptions above, an example where either the CVD or the mix mode is selected according to the roughness of the pattern on the substrate has been described. However, the substrate processing method according to the second embodiment is not limited thereto. For example, a first threshold value and a second threshold value larger than the first threshold value are set in advance according to, for example, the shape of the pattern on the substrate to be processed such as the roughness. In an example, the first threshold value is set to an upper limit value at which the roughness of the pattern on the substrate may be flattened by the CVD, and the second threshold value is set to a lower limit value at which the roughness of the pattern on the substrate may be flattened by the ALD. Next, before a processing is performed or after a processing is performed a predetermined number of times, the shape of the pattern on the substrate to be processed such as the roughness is measured, and the measured value is compared with the first threshold value and the second threshold value. When the measured value is equal to or less than the first threshold value, the CVD is selected as the film formation processing. When the measured value is larger than the first threshold value and less than the second threshold value, the mix mode described above is selected as the film formation processing. When the measured value is equal to or larger than the second threshold value, the ALD is selected as the film formation processing. Then, the roughness of the pattern on the substrate is improved by the selected film formation processing.

Referring back to FIG. 12, descriptions of the substrate processing apparatus 100A according to the second embodiment will be continued. The controller 120A includes the acquisition unit 123, in addition to the selection unit 121 and the instruction unit 122 which are similar to those in the first embodiment.

The acquisition unit 123 acquires the measured value from the measuring apparatus 300 or the like through the input unit 130 and/or the communication unit 150. The measured value that is acquired by the acquisition unit 123 includes the above-described aspect ratio and power spectral density.

Figure 15:
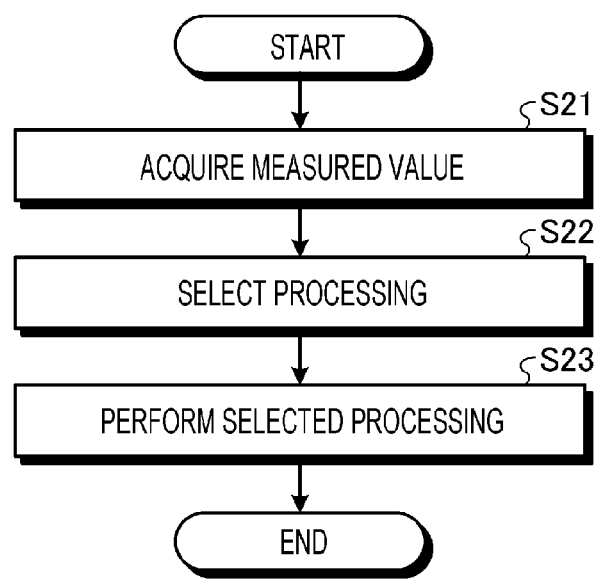
FIG. 15 is a flowchart illustrating an example of the flow of a substrate processing method according to the second embodiment.

FIG. 15 is a flowchart illustrating an example of the flow of the substrate processing method according to the second embodiment. First, the acquisition unit 123 acquires the measured value of the pattern formed on the substrate to be processed (step S21). Further, the acquisition unit 123 acquires a target value of a pattern to be formed on the substrate to be processed, for example, Device ID. Subsequently, the selection unit 121 refers to the association storage unit 113, and selects a processing that corresponds to the target value and the measured value that have been acquired (step S22). The selection unit 121 sends the selected processing to the instruction unit 122. The instruction unit 122 instructs the processing apparatus 200 to perform a processing based on the processing received from the selection unit 121 (step S23). Then, the processing ends.

The substrate processing apparatuses 100 and 100A may repeatedly perform the processing described above on one substrate. For example, the substrate processing apparatuses 100 and 100A may select and perform the next processing each time the performance of the current processing is completed.

In the second embodiment, the association table stored in the association storage unit 113 may be appropriately updated according to the processing result in the processing apparatus 200. For example, the measuring apparatus 100 may acquire measured values that represent the shape of the pattern on the substrate before and after a processing. For example, the measuring apparatus 300 may measure the state of the pattern on the substrate each time a processing ends in the processing apparatus 200, and transmit the measured value to the substrate processing apparatus 100A. Then, the substrate processing apparatus 100A may update the association table according to a difference between the measured value after the processing and the target value. Further, the substrate processing apparatus 100A may generate the association table by a machine learning based on the measured values of the pattern on the substrate before and after the performance of a processing, and the target value.

(Effects of Second Embodiment)

As described above, the substrate processing method according to the second embodiment includes the step of measuring the value that represents the shape of the pattern on the substrate surface before a processing is performed, and the step of selecting a processing condition based on the measured value. The processing is performed under the selected processing condition. For example, the substrate processing apparatus performs the purging step under selected processing condition. As a result, according to the second embodiment, the substrate processing apparatus may select a processing to be performed according to the shape of the pattern on the substrate. Thus, the substrate processing apparatus may select and perform the processing that implements the coverage in accordance with the state of the pattern on the substrate.

The substrate processing method according to the second embodiment may include the step of measuring the value that represents the shape of the pattern on the substrate surface after a processing is performed a predetermined number of times. The substrate processing method according to the second embodiment may include the step of selecting a processing condition for a processing to be subsequently performed, based on the difference between the measured value before the processing is performed and the measured value after the processing is performed a predetermined number of times. As a result, according to the second embodiment, the next processing may be selected after the processing performance is evaluated.

The substrate processing method of the second embodiment may also further include the step of etching the substrate using the film formed on the surface of the substrate as a mask (protective film), and repeatedly perform the film formation and the etching two or more times. In this case, the film formation and the etching may be performed in the same chamber or in different chambers.

(Example of Processing Apparatus 200 according to Embodiment)

Figure 16:
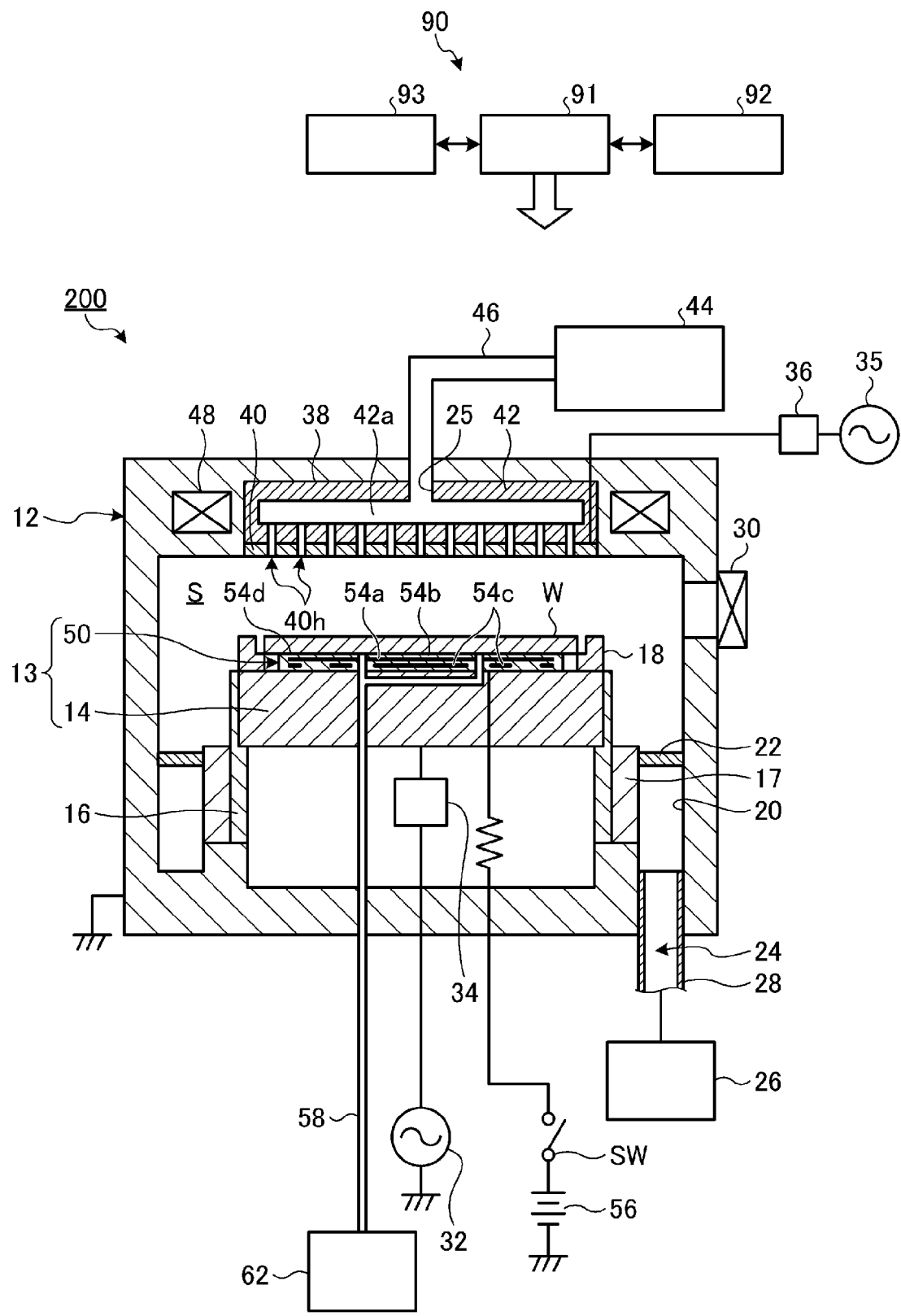
FIG. 16 is a view illustrating an example of a configuration of a processing apparatus in which a substrate processing according to the first and second embodiments is performed.

FIG. 16 is a view illustrating an example of a configuration of the processing apparatus 200 in which the substrate processing according to the first and second embodiments is performed. FIG. 16 illustrates a schematic cross section of the processing apparatus 200. The processing apparatus 200 illustrated in FIG. 16 is a parallel flat plate type plasma processing apparatus. The processing apparatus capable of performing the substrate processing of the first and second embodiments is not limited to the processing apparatus illustrated in FIG. 16.

The processing apparatus 200 includes a chamber 12 that is airtightly configured. The chamber 12 has a substantially cylindrical shape, and defines a processing space S where plasma is generated, as an internal space thereof. The processing apparatus 200 includes a stage 13 inside the chamber 12. The upper surface of the stage 13 is formed as a placement surface 54d on which a wafer W to be processed is placed. In the present embodiment, the stage 13 includes a base 14 and an electrostatic chuck 50. The base 14 has a substantially disc shape, and is provided at a lower portion of the processing space S. The base 14 is made of, for example, aluminum and has a function of a lower electrode.

The electrostatic chuck 50 is provided on the upper surface of the base 14. The electrostatic chuck 50 has a disc shape with a flat upper surface, and the upper surface corresponds to the placement surface 54d on which the wafer W is placed. The electrostatic chuck 50 has an electrode 54a and an insulator 54b. The electrode 54a is provided inside the insulator 54b, and a DC power supply 56 is connected to the electrode 54a via a switch SW. When a DC voltage is applied to the electrode 54a from the DC power supply 56, a Coulomb force is generated, and the wafer W is adsorbed and held on the electrostatic chuck 50 by the Coulomb force. Further, the electrostatic chuck 50 includes a heater 54c inside the insulator 54b. The heater 54c heats the electrostatic chuck 50 in the manner that a power is supplied from a power feeding mechanism (not illustrated) to the heater 54c. As a result, the temperatures of the stage 13 and the wafer W are controlled.

In the present embodiment, the processing apparatus 200 further includes a tubular holder 16 and a tubular support 17. The tubular holder 16 is in contact with the lateral surface and the edge of the bottom surface of the base 14, to hold the base 14. The tubular support 17 extends vertically from the bottom of the chamber 12, and supports the base 14 via the tubular holder 16.

A focus ring 18 is provided on the edge of the upper surface of the base 14. The focus ring 18 is a member for improving the in-plane uniformity of the processing accuracy of the wafer W. The focus ring 18 is a plate-shaped member having a substantially ring shape, and is made of, for example, silicon, quartz, or silicon carbide.

In the present embodiment, an exhaust passage 20 is formed between the side wall of the chamber 12 and the tubular support 17. A baffle plate 22 is attached to the entrance of the exhaust passage 20 or in the middle thereof. An exhaust port 24 is formed at the bottom of the exhaust passage 20. The exhaust port 24 is defined by an exhaust pipe 28 fitted into the bottom of the chamber 12. An exhaust device 26 is connected to the exhaust pipe 28. The exhaust device 26 has a vacuum pump, and by operating the vacuum pump, the processing space S inside the chamber 12 may be depressurized to a predetermined degree of vacuum. As a result, the processing space S inside the chamber 12 is maintained in a vacuum atmosphere. The processing space S is an example of a vacuum space. A gate valve 30 is attached to the side wall of the chamber 12 to open/close the carry in/out port of the wafer W.

A radio-frequency power supply 32 is electrically connected to the base 14 via a matching unit 34. The radio-frequency power supply 32 is a power supply for generating plasma, and applies a radio-frequency power of a predetermined frequency (e.g., 13 MHz) to the lower electrode, that is, the base 14. A refrigerant flow path (not illustrated) is formed inside the base 14, and the processing apparatus 200 circulates a refrigerant in the refrigerant flow path so as to cool the stage 13. As a result, the temperatures of the stage 13 and the wafer W are controlled.

The processing apparatus 200 further includes a shower head 38 in the chamber 12. The shower head 38 is provided at the upper portion of the processing space S. The shower head 38 includes an electrode plate 40 and an electrode support 42.

The electrode plate 40 is a conductive plate having a substantially disc shape, and makes up an upper electrode. A radio-frequency power supply 35 is electrically connected to the electrode plate 40 via a matching unit 36. The radio-frequency power supply 35 is a power supply for generating plasma, and applies a radio-frequency power of a predetermined frequency (e.g., 60 MHz) to the electrode plate 40. When the radio-frequency power supply 32 and the radio-frequency power supply 35 apply the radio-frequency power to the base 14 and the electrode plate 40, respectively, a radio-frequency electric field is formed in the space between the base 14 and the electrode plate 40, that is, in the processing space S.

A plurality of gas vent holes 40h is formed in the electrode plate 40. The electrode plate 40 is detachably supported by the electrode support 42. A buffer chamber 42a is provided inside the electrode support 42. The processing apparatus 200 further includes a gas supply 44, and the gas supply 44 is connected to a gas inlet port 25 of the buffer chamber 42a via a gas supply conduit 46. The gas supply 44 supplies a processing gas into the processing space S. The processing gas may be, for example, a processing gas for the etching or the film formation. A plurality of holes is formed in the electrode support 42 to be continuous to the plurality of gas vent holes 40h, respectively, and communicate with the buffer chamber 42a. The gas supplied from the gas supply 44 is supplied into the processing space S via the buffer chamber 42a and the gas vent holes 40h.

In the present embodiment, a magnetic field forming mechanism 48 is provided in the ceiling portion of the chamber 12 to extend in an annular shape or concentrically. The magnetic field forming mechanism 48 functions to facilitate the start of the injection of the radio frequency (plasma ignition) in the processing space S, and maintain the injection stably.

In the present embodiment, the processing apparatus 200 further includes a gas supply line 58 and a heat transfer gas supply 62. The heat transfer gas supply 62 is connected to the gas supply line 58. The gas supply line 58 extends to the upper surface of the electrostatic chuck 50, and extends in an annular shape in the upper surface of the electrostatic chuck 50. The heat transfer gas supply 62 supplies a heat transfer gas such as, for example, He gas between the upper surface of the electrostatic chuck 50 and the wafer W.

The controller 90 comprehensively controls the operation of the processing apparatus 200 configured as described above. The controller 90 includes a process controller 91 provided with a central processing unit (CPU) to control each unit of the processing apparatus 200, a user interface 92, and a storage unit 93. In the present embodiment, the controller 90 may be provided inside the substrate processing apparatuses 100 and 100A.

The user interface 92 is configured by, for example, a keyboard with which a process manager performs an operation to input commands for managing the processing apparatus 200, or a display that visualizes and displays the operation status of the processing apparatus 200.

The storage unit 93 stores control programs (software) for implementing various types of processing performed in the processing apparatus 200 under the control of the process controller 91, and a recipe that stores, for example, processing condition data. Then, when an arbitrary recipe is retrieved from the storage unit 93 by, for example, an instruction from the user interface 92 and executed by the process controller 91 as necessary, a desired processing is implemented in the processing apparatus 200 under the control of the process controller 91. The control programs or the recipe such as processing condition data may be stored in a computer-readable storage medium (e.g., a hard disk, a CD, a flexible disk or a semiconductor memory).

Further, the control programs or the recipe such as processing condition data may be used online by being transmitted from another device at any time through, for example, a dedicated line.

Figure 17:
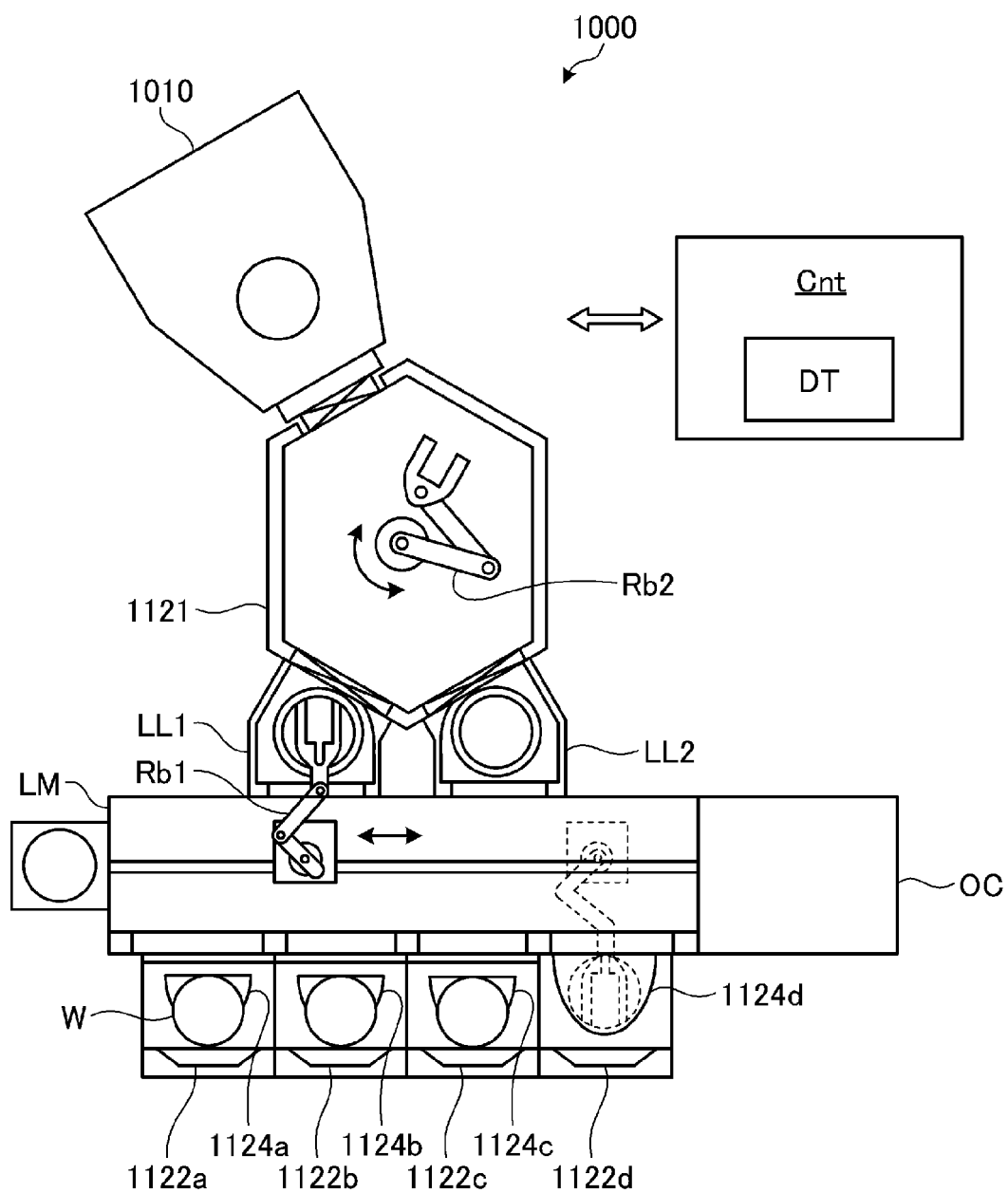
FIG. 17 is a view illustrating an example of a processing system which is usable for performing the substrate processing according to the first and second embodiments.

FIG. 17 is a view illustrating an example of a processing system which is usable for performing the substrate processing according to the first and second embodiments.

A processing system 1000 illustrated in FIG. 17 includes a controller Cnt, mounts 1122a, 1122b, 1122c, and 1122d, accommodation containers 1124a, 1124b, 1124c, and 1124d, a loader module LM, and load lock chambers LL1 and LL2, a transfer chamber 1121, and a plasma processing apparatus 1010. The plasma processing apparatus 1010 may be, for example, the processing apparatus 200 illustrated in FIG. 16.

The controller Cnt is a computer provided with, for example, a processor, a storage unit, an input device, and a display device, and controls each unit of the processing system 1000 to be described later. The controller Cnt is connected to, for example, transfer robots Rb1 and Rb2, an optical observation device OC, the plasma processing apparatus 1010. The controller Cnt may also serve as the controllers 120 and 120A of the substrate processing apparatuses 100 and 100A illustrated in FIGS. 7 and 12 and the controller 90 of the processing apparatus 200 illustrated in FIG. 16. Further, the controller Cnt may be the substrate processing apparatus 100 or 100A.

The controller Cnt operates according to a computer program (a program based on an input recipe) for controlling each unit of the processing system 1000, and sends out a control signal. The respective units of the processing system 1000, for example, the transfer robots Rb1 and Rb2, the optical observation device OC, and each unit of the plasma processing apparatus 1010 are controlled by the control signal from the controller Cnt. In the plasma processing apparatus 1010, the selection and the flow rate of a gas from the gas supply 44, the exhaust of the exhaust device 26, the supply of power from the radio-frequency power supplies 32 and 35, the supply of power to the heater 54c, and the flow rate and the temperature of the refrigerant may be controlled by the control signal from the controller Cnt. Each step of the substrate processing method according to the first and second embodiments may be performed by operating each unit of the processing system 1000 under the control of the controller Cnt. The storage unit of the controller Cnt stores a computer program for executing the substrate processing method according to the first and second embodiments, and various data used for the execution, in a freely readable manner.

The mounts 1122a to 1122d are arranged along one edge of the loader module LM. The accommodation containers 1124a to 1124d are provided on the mounts 1122a to 1122d, respectively. The wafer W may be accommodated in each of the accommodation containers 1124a to 1124d.

The transfer robot Rb1 is provided inside the loader module LM. The transfer robot Rb1 takes out the wafer W accommodated in any one of the accommodation containers 1124a to 1124d, and transfers the wafer W to the load lock chamber LL1 or LL2.

The load lock chambers LL1 and LL2 are provided along the other edge of the loader module LM, and connected to the loader module LM. The load lock chambers LL1 and LL2 make up preliminary decompression chambers. Each of the load lock chambers LL1 and LL2 is connected to the transfer chamber 1121.

The transfer chamber 1121 is a chamber that may be depressurized, and the transfer robot Rb2 is provided inside the transfer chamber 1121. The plasma processing apparatus 1010 is connected to the transfer chamber 1121. The transfer robot Rb2 takes out the wafer W from the load lock chamber LL1 or LL2, and transfers the wafer W to the plasma processing apparatus 1010.

The processing system 1000 includes the optical observation device OC. The wafer W may be moved between the optical observation device OC and the plasma processing apparatus 1010 by the transfer robots Rb1 and Rb2. After the wafer W is accommodated in the optical observation device OC by the transfer robot Rb1 and aligned inside the optical observation device OC, the optical observation device OC measures the trench width of the pattern such as the mask of the wafer W, and transmits the measurement result to the controller Cnt. The optical observation device OC may measure trench widths of patterns such as masks formed in a plurality of regions of the surface of the wafer W. The measurement result obtained by the optical observation device OC is used as, for example, the "measured value" in the second embodiment (see FIG. 15).

According to the present disclosure, the coverage of a film formed on a substrate may be continuously controlled.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for processing a substrate comprising:
   (a) exposing a substrate with a pattern formed on a surface thereof to a first reactive species in a chamber, thereby adsorbing the first reactive species onto the surface of the substrate;
   (b) exposing the substrate to plasma formed by a second reactive species in the chamber, thereby forming a film on the surface of the substrate; and
   (c) repeating a processing including (a) and (b) two or more times while changing a residence amount of the first reactive species at a time of starting (b).

2. The method according to claim 1, wherein the residence amount of the first reactive species at the time of starting (b) is changed by controlling an amount of the first reactive species introduced into the chamber in (a).

3. The method according to claim 1, wherein the residence amount of the first reactive species at the time of starting (b) is changed by controlling a dilution degree of the first reactive species introduced into the chamber in (a).

4. The method according to claim 1, wherein (a) includes:
   (a1) introducing the first reactive species into the chamber; and
   (a2) purging at least a portion of the first reactive species from the chamber.

5. The method according to claim 4, wherein the residence amount of the first reactive species at the time of starting (b) is changed by controlling an amount of the first reactive species purged in (a2).

6. The method according to claim 5, wherein the residence amount of the first reactive species at the time of starting (b) is changed by controlling the amount of the first reactive species purged in (a2) in a manner of changing at least one of a pressure in the chamber, a purging time, and a flow rate of a purge gas.

7. The method according to claim 1, wherein (a) or (b) is terminated before a reaction on the surface of the substrate is saturated.

8. The method according to claim 1, wherein the residence amount of the first reactive species at the time of starting (b) is controlled to make a thickness of a film formed on an upper portion of the pattern larger than a thickness of a film formed on a lower portion of the pattern.

9. The method according to claim 1, wherein the residence amount of the first reactive species at the time of starting (b) is controlled to make a thickness of a film formed on an upper portion of the pattern similar to a thickness of a film formed on a lower portion of the pattern.

10. The method according to claim 1, further comprising:
    (d) etching the substrate using the film formed in (c) as a mask.

11. The method according to claim 10, further comprising:
    (e) repeating a processing including (c) and (d) two or more times.

12. The method according to claim 1, further comprising:
    measuring a value that represents a shape of the pattern on the surface of the substrate before (a) is performed; and
    selecting a processing condition based on the measured value, wherein (a), (b), and (c) are performed under the processing condition selected in the selecting.

13. The method according to claim 12, further comprising:
    measuring a value that represents the shape of the pattern on the surface of the substrate after (c) is performed a predetermined number of times; and
    selecting a processing condition for a processing to be subsequently performed, based on a difference between the value measured before (a) is performed and the value measured after (c) is performed a predetermined number of times.

14. The method according to claim 1, wherein (c) is repeatedly performed until the shape of the pattern satisfies a predetermined condition.

15. The method according to claim 1, wherein (c) is performed in a same chamber.

16. The method according to claim 1, wherein (c) is performed by setting the pressure in the chamber to about 10 mTorr to about 200 mTorr.

17. A method for processing a substrate comprising:
    measuring a value that represents a shape of a pattern on a surface of the substrate;

comparing the value with a first threshold value and a second threshold value larger than the first threshold value, which are set in advance;

selecting a film formation processing based on a result of the comparing; and forming a film on the surface of the substrate according to the film formation processing selected in the selecting, wherein selecting a film formation processing includes:

selects a chemical vapor deposition (CVD) as the film formation processing when the value is equal to or smaller than the first threshold value, selects a mix mode as the film formation processing when the value is larger than the first threshold value and smaller than the second threshold value, and selects an atomic layer deposition (ALD) as the film formation processing when the value is equal to or larger than the second threshold value, and wherein the mix mode includes:

(a) exposing the substrate with a pattern formed on a surface thereof to a first reactive species in a chamber, thereby adsorbing the first reactive species onto the surface of the substrate;

(b) exposing the substrate to plasma formed by a second reactive species in the chamber, thereby forming a film on the surface of the substrate; and (c) repeating a processing including (a) and (b) two or more times while changing a residence amount of the first reactive species at a time of starting (b).

18. An apparatus for processing a substrate, comprising:

a chamber including a gas inlet and a gas outlet;

a plasma generator configured to generate plasma in the chamber; and a controller configured to control an overall operation of the apparatus for processing the substrate and programmed to:

(a) expose the substrate with a pattern formed on a surface thereof to a first reactive species in the chamber, thereby adsorbing the first reactive species onto the surface of the substrate;

(b) expose the substrate to the plasma generated by the plasma generator and formed by a second reactive species in the chamber, thereby forming a film on the surface of the substrate; and (c) repeat a processing including (a) and (b) two or more times while changing a residence amount of the first reactive species at a time of starting (b).

* * * * *